(12) United States Patent
Gooi et al.

(10) Patent No.: US 12,327,951 B2
(45) Date of Patent: Jun. 10, 2025

(54) RUGGED RETAINER MOUNTING POINT SYSTEM

(71) Applicant: SMART Modular Technolgies Sdn. Bhd., Pulau Pinang (MY)

(72) Inventors: Kwang Jin Gooi, Pulau Pinang (MY); Satyanarayan Iyer, Fremont, CA (US); Muhammad Annuar Bin Johani, Pulau Pinang (MY); Ali Akbar Bin Abdu Aziz, Pulau Pinang (MY)

(73) Assignee: Smart Modular Technologies, Sdn. Bhd, Pulau Pinang (MY)

( * ) Notice: Subject to any disclaimer, the term of this patent is extended or adjusted under 35 U.S.C. 154(b) by 337 days.

(21) Appl. No.: 17/826,079

(22) Filed: May 26, 2022

(65) Prior Publication Data
US 2022/0399682 A1 Dec. 15, 2022

(30) Foreign Application Priority Data
Jun. 9, 2021 (MY) .............................. PI2021003206

(51) Int. Cl.
*H01R 13/639* (2006.01)
*H01R 12/73* (2011.01)
*H01R 25/00* (2006.01)

(52) U.S. Cl.
CPC ......... *H01R 13/639* (2013.01); *H01R 12/737* (2013.01); *H01R 25/006* (2013.01)

(58) Field of Classification Search
CPC ... H01R 13/639; H01R 12/737; H01R 25/006
USPC ....................................................... 439/327
See application file for complete search history.

(56) References Cited

U.S. PATENT DOCUMENTS

| | | | |
|---|---|---|---|
| 6,188,576 B1 * | 2/2001 | Ali ...................... | G06K 19/077 361/719 |
| 6,353,538 B1 * | 3/2002 | Ali ...................... | H01L 25/0655 174/548 |
| 6,362,966 B1 * | 3/2002 | Ali ...................... | H05K 7/1431 361/728 |
| 10,211,572 B1 * | 2/2019 | M R ..................... | H01R 13/639 |
| 10,734,763 B2 * | 8/2020 | M R ..................... | G06F 1/185 |
| 10,763,606 B1 * | 9/2020 | Esmaily ............. | H01R 13/5219 |
| 10,955,881 B2 * | 3/2021 | Gopalakrishna .... | H01L 23/4093 |

(Continued)

FOREIGN PATENT DOCUMENTS

| | | | | |
|---|---|---|---|---|
| CN | 2329095 Y | * | 7/1999 | ............. H01R 13/62 |
| CN | 2556705 Y | * | 6/2003 | ............... G06F 1/16 |

(Continued)

OTHER PUBLICATIONS

Office Action for Malaysian Patent Application No. PI2021003206, mailed Dec. 26, 2023, 5 pages.

*Primary Examiner* — Peter G Leigh
(74) *Attorney, Agent, or Firm* — Withrow & Terranova, P.L.L.C.

(57) ABSTRACT

A memory module operation system for operating in high stress environments with strong vibration. The application and use of a retainer to reduce and dampen the effects of system vibration and the application of dynamic loads can retain a memory module in place in a memory socket. Further, the retainer can operate to reduce the effects of electromagnetic interference and can act as a heat transport system to reduce thermal stress on components.

10 Claims, 15 Drawing Sheets

(56) References Cited

U.S. PATENT DOCUMENTS

| | | | | |
|---|---|---|---|---|
| 2002/0072263 | A1* | 6/2002 | Fumikura | H01R 12/7005 439/327 |
| 2010/0015820 | A1* | 1/2010 | Wang | H01R 12/88 439/59 |
| 2011/0053391 | A1* | 3/2011 | Vrenna | H01R 12/721 439/78 |
| 2011/0059654 | A1* | 3/2011 | Zhu | H01R 12/707 439/630 |
| 2013/0078862 | A1* | 3/2013 | Kato | H01R 12/7029 439/629 |
| 2014/0080343 | A1* | 3/2014 | Wang | H01R 12/721 439/325 |
| 2014/0080345 | A1* | 3/2014 | Xu | H01R 12/7029 439/327 |
| 2014/0368988 | A1* | 12/2014 | Tobias | G06F 1/20 361/679.31 |
| 2017/0069985 | A1* | 3/2017 | Schulze | G06F 1/183 |
| 2018/0102608 | A1* | 4/2018 | Sun | H01R 12/721 |
| 2018/0321715 | A1* | 11/2018 | Gopalakrishna | G06F 1/20 |

FOREIGN PATENT DOCUMENTS

| | | | | |
|---|---|---|---|---|
| CN | 201327888 Y | * | 10/2009 | |
| CN | 201408859 Y | * | 2/2010 | |
| CN | 102957011 B | * | 7/2015 | H01R 13/6275 |
| JP | 3371248 B2 | * | 1/2003 | |

* cited by examiner

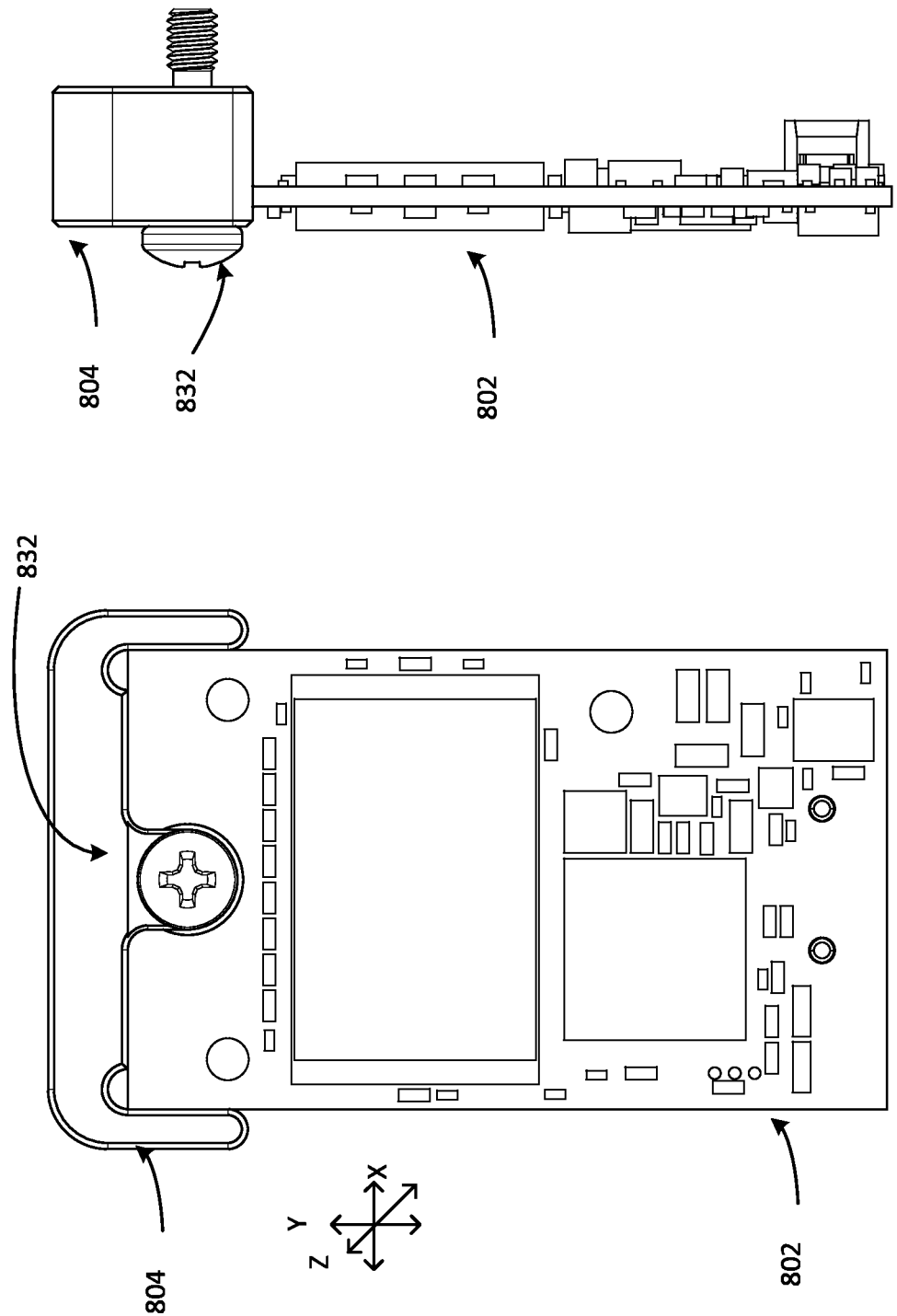

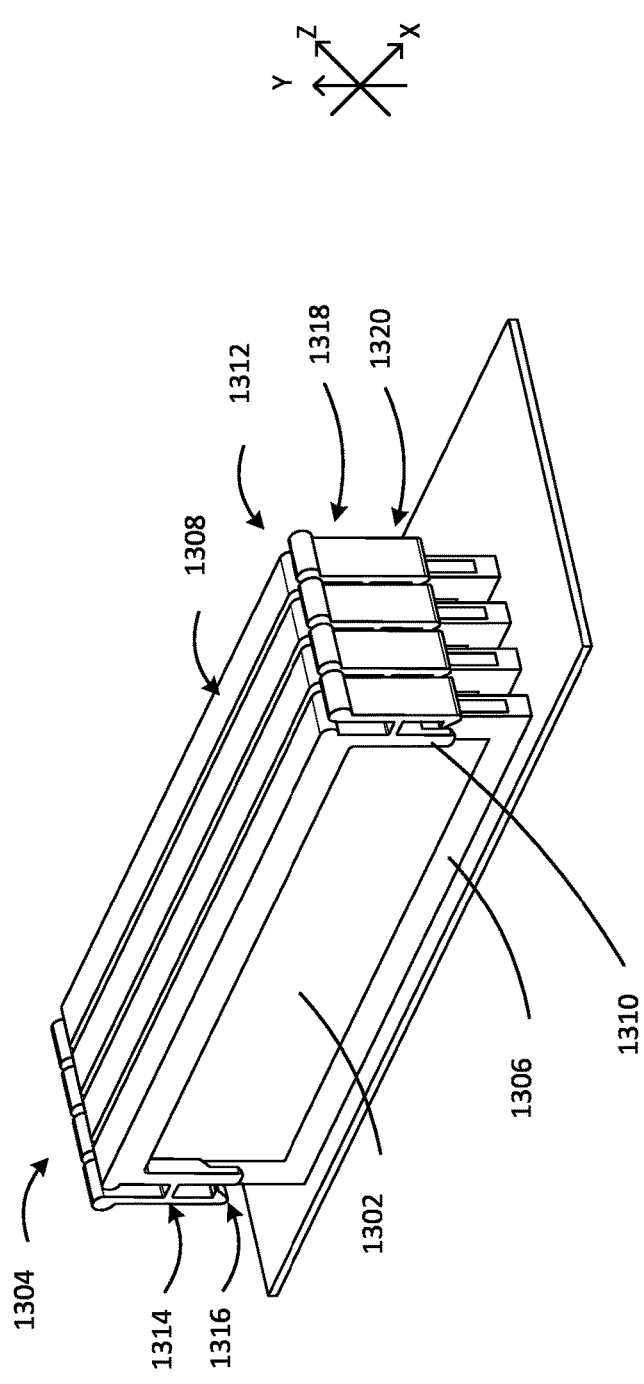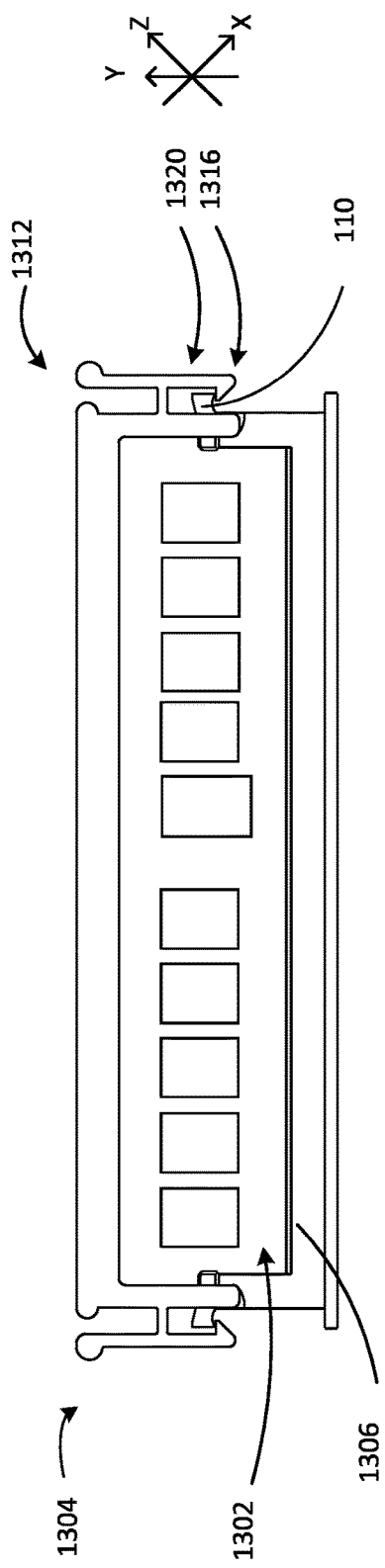
FIG. 13
FIG. 14

RUGGED RETAINER MOUNTING POINT SYSTEM

This application claims priority to Malaysian patent application no. PI2021003206, filed Jun. 9, 2021, and issued as Malaysian patent no. MY-204524-A on Sep. 2, 2024, the disclosure of which is incorporated herein by reference in its entirety.

TECHNICAL FIELD

Embodiments relate generally to memory modules attached to computer systems, and, more specifically, to electronic modules attached to computer systems in ruggedized environments with vibration.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Modern computing involve certain operations of computer systems that are equipped with main memory units and memory storage sub-systems for processing by one or more processors. The memory units can be used to store data and include high speed interfaces between memory modules and the processor units of the computer systems. The memory units can be modular electronic devices coupled to sockets to allow for replaceability and upgradeability.

As technology has improved, the memory modules have increased in capacity and performance. The memory bus interface between the memory modules and the computing systems have increased in size and speed to match the memory modules. Evaluating and testing the memory modules mounted in the memory sockets is required for verify performance of the memory modules and the computer system.

Further, as computer systems are more widely used in industrial and consumer environments, they must be adequately tested under a variety of harsh environmental conditions. These computer systems must be tested and operated under real-world conditions while constrained by available operation parameters including limited space, different shapes, and available power and thermal limitations.

The requirements of modern computer systems and their associated memory testing systems are constantly increasing to accommodate the ever increase needs of modern computing applications. Computing power, local memory speed, storage capacity, data transfer rates, and power requirements grow without limit and require innovative solutions to satisfy the demands of modern computer systems and their deployment environments.

BRIEF DESCRIPTION OF THE DRAWINGS

The present invention is illustrated by way of example, and not by way of limitation, in the figures of the accompanying drawings and in which like reference numerals refer to similar elements and in which:

FIG. 8 depicts a top view of a retainer and the memory module, FIG. 9 depicts a side view of the retainer and the memory module, FIG. 13 depicts an exemplary isometric view of a retainer attached to the plurality of memory modules, FIG. 14 depicts a front view of the memory module 1302 secured with the retainer.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. General Overview
2.0. Structural Overview
3.0. Implementation MechanismS—System Overview
3.1. Memory Modules
3.2. Retainers
4.0. Functional Overview
5.0. Example Embodiments
6.0. Extensions and Alternatives 1.0 General Overview Approaches, techniques, and mechanisms are disclosed for operating memory modules in high dynamic stress environments including high vibration. The system with the memory-modules can be operated in an industrial environment including vibratory environments and will retain the memory modules in place in the memory sockets during operation.

The system can include a computing system than can execute programs to check the quality, operation, capacity, and other characteristics of memory modules. The memory modules can be attached to memory sockets that can be embedded in the testing system or deployed on dedicated testing units. The testing system can include environmental testing such as vibration testing or other ruggedized testing types.

According to one embodiment, the memory modules can be attached in place in the memory sockets using a retainer to secure the memory modules in place. However, in high vibration situations, the memory modules can become loose or dislodge completely if the mechanisms to secure the memory modules do not hold. The retainer provides additional support for the memory sockets and prevents the memory modules from coming loose and detaching.

According to another embodiment, the retainer provide stability and retention along all three axes. The structure of the retainer secures the memory module to the memory socket with triple redundancy in the x-direction, the y-direction, and the z-direction.

In other aspects, the invention encompasses different testing and retention apparatuses and systems configured to carry out the foregoing techniques.

2.0 Structural Overview

Figure 1:
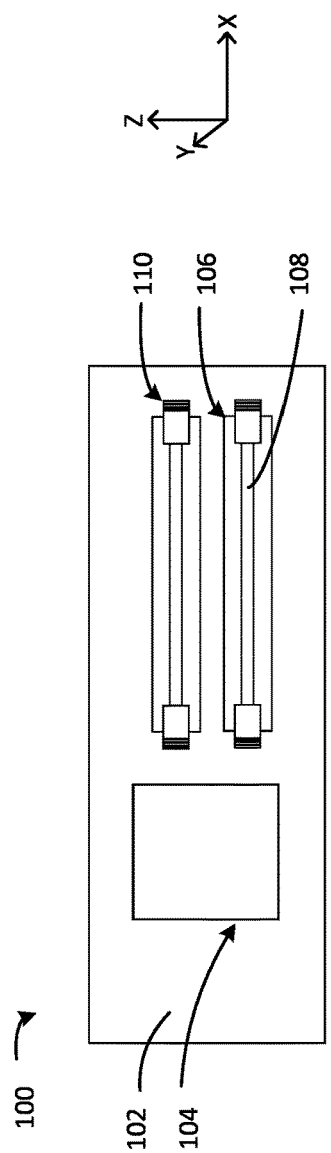
FIG. 1 depicts a view of a computer system having memory module in an embodiment.

FIG. 1 illustrates a computer system 100 having memory module 108 in a memory socket 106 in an embodiment. The computer system 100 can include a processor unit 104 and one or more of the memory sockets 106 attached to a motherboard 102. The memory sockets 106 can have the memory modules 108 secured in place using socket latches 110.

The computer system 100 can represent a consumer, industrial, or test system. For example, the computer system 100 can be a system for testing the memory modules 108. In another example, the computer system 100 can be subject to harsh environmental conditions including vibration, mechanical friction, and other factors.

In an example, the computer system 100 can be a system for testing the memory modules 108. In other examples, the computer system 100 can be a computer system in a regular operational environment.

Although the computer system 100 is shown with two of the memory modules 108, it is understood that the computer system 100 can have any number of the memory sockets 106 and the memory modules 108. Further, the memory sockets 106 may be attached directly to the motherboard 102 or may be on a separate test board (not shown) and coupled to the motherboard 102.

The motherboard 102 is a mounting surface for attaching components of the computer system 100. The motherboard 102 can be a printed circuit board, a flexible circuit board, a flat circuit board, or similar mounting surface with conductive traces to convey electronic signals between components. The motherboard 102 can be a flat mounting surface, a curved mounting surface, a daughterboard, a substrate, a carrier, or similar type structure.

The socket latches 110 are moveable mechanical structures for holding the memory modules 108 in place when the socket latches 110 are closed. The socket latches 110 can eject the memory modules 108 when the socket latches 110 are opened.

The computer system 100 can include the motherboard 102 oriented in an x-z plane. The x-axis can be oriented along the length of the memory sockets 106. The z-axis can represent depth and be oriented along the direction between the processor unit 104 and the memory sockets 106. The y-axis can represent the vertical height and be oriented perpendicular to the x-z plane of the motherboard 102. Although the orientations of the various system components are given, it is understood that different physical configurations can be used and the axes can be changed, swapped, or modified as needed. The directions are provided as guidelines to show different embodiments and other possible configurations.

Figure 2:
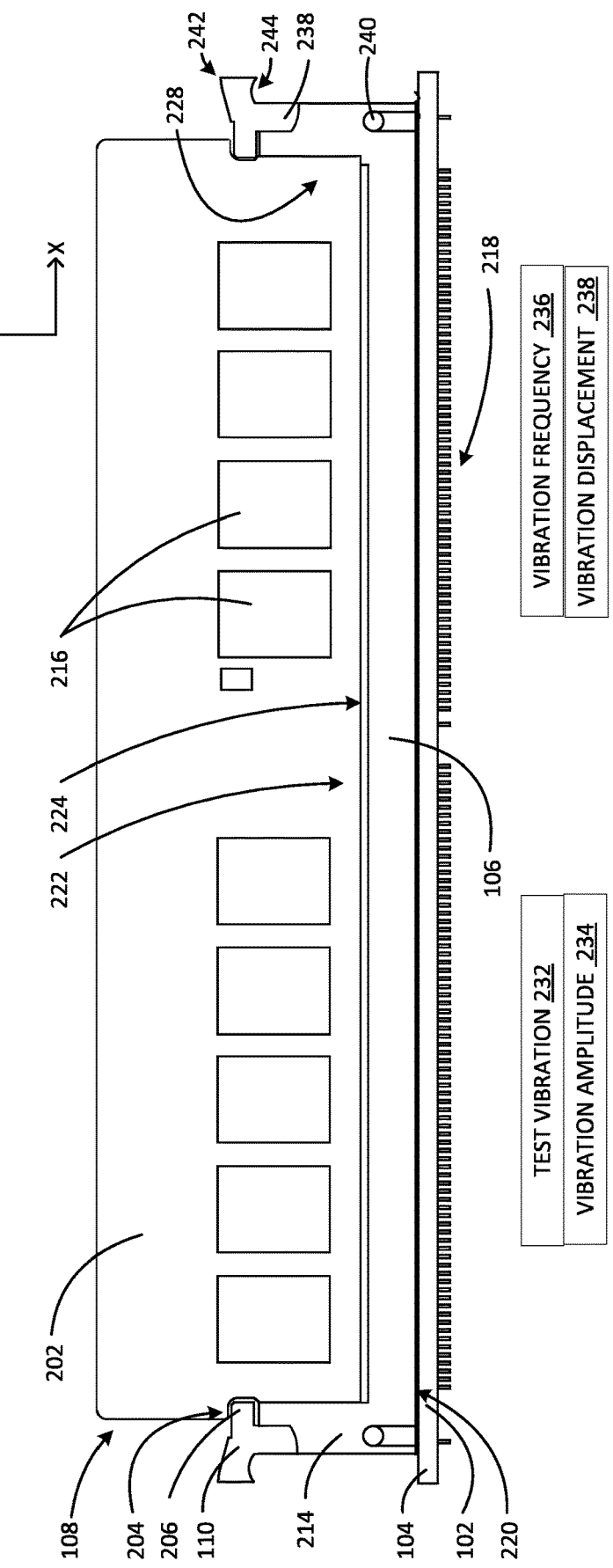
FIG. 2 depicts an example of a memory module attached to the memory socket in a further embodiment.

FIG. 2 illustrates an example of a memory module 108 attached to the memory socket 106 in a further embodiment. The memory module 108 can be attached to the memory socket 106 mounted on the motherboard 102.

The memory socket 106 is a mechanical structure acting as an interface between the motherboard 102 and the memory module 108. The memory socket 106 can have a variety of configuration. For example, the memory socket 106 can be a DDR3 DIMM socket, a DDR4 DIMM socket, a DDR5 DIMM socket, or a socket for a similar memory device type.

The memory socket 106 can be attached to the motherboard 102 using the socket pins 218. The socket pins 218 are electrically conductive elements for providing a conductive path to the socket and to the pins of the memory modules 108.

The memory socket 106 can include the socket body 220 having module support towers 214 at each end of the socket body 220. The module support towers 214 are vertical structural elements for holding the memory modules 202 and the socket latches 110. The socket latches 110 can be rotationally coupled to the memory socket 106. The socket latches 110 can include a pin, shaft, journal, or other mechanical element. The socket body 220 can be formed from plastics, liquid crystal polymers, polyamide, resin, nylon, or other heat resistant materials with high mechanical strength.

The socket latches 110 are structural elements shaped to provide retention for the memory module 108. The socket latches 110 can be rotational coupled to the memory socket 106. The socket latches 110 can also be used to eject the memory module 108 by opening the socket latches 110.

The socket body 220 can include the socket slot 222 for holding the memory module 108. The socket slot 222 can include socket contacts 224 for electrically connecting with the pins of the memory module 108. The socket contacts 224 are electrical conductors for receiving electrical signals from the memory module 108.

The memory module 108 can include the memory chips 216 mounted on a module circuit board 202 and memory module notches 204 in the module circuit board 202. The memory chips 216 are the integrated circuits that provide the memory storage area for the module.

The memory module 108 can be inserted into the socket slot 222 of the memory socket 106 and secured in place using the socket latches 110. The socket latches 110 can include a socket latch tab 206 that is configured to fit into the memory module notch 204 to hold the memory module 108 in place when the socket latches 110 are engaged.

The socket latches 110 can include a latch head 242 and a latch shaft 238. The latch shaft 238 can extend down from the latch head 242 to a latch pivot 240. The latch shaft 238 is a portion of the socket latches 110 that can act as the body of the latch. The latch pivot 240 is a structure for rotationally coupling the socket latches 110 to the memory socket 106. For example, the latch pivot 240 can be a pin or shaft attached to the memory socket 106 with the latch pivot 240 in a hole in the latch shaft 238. The socket latches 110 can rotate around the latch pivot 240.

The latch head 242 is the top portion of the socket latches 110 and can include a serrated top area and the socket latch tab 206. The socket latches 110 can include a latch head bottom side 244 of the socket latches 110.

The memory module notch 204 can have different configurations. For example, the DDR3 DIMM memory module can have two notches to accommodate low profile modules and very low-profile modules. The DDR4 DIMM memory module can have a single notch for both the low-profile modules and the very low-profile modules.

In an illustrative example, the memory module 108 can be inserted into the memory socket 106 with the application of sufficient force. In one case, the memory socket 106 can have an insertion force of approximately 106 Newtons (N). In another case, the memory socket 106 can require an insertion force of more than 106 N.

In some environments, the computer system 100 can experience vibration and other mechanical forces that can potentially jolt the memory module 108 from the memory socket 106. For example, this can include test environments or production environments in factory conditions. In cases like this, the memory module 108 needs to be attached to the memory socket 106 in a more secure manner.

In an illustrative example, securing the memory module 108 in the socket slot 222 in an environment with sufficient vibration to dislodge the memory module 108 can support the proper operation of the memory module 108. Minimizing unnecessary and unwanted motion between the memory module 108 and the memory socket 106 can reduce the number of errors or other operational problems with the memory module 108.

In the test environment, a test vibration 232 can be applied to the computer system 100. The test vibration 232 can be an example of the vibratory environment that the system may encounter. The test vibration 232 can be applied in a variety of ways. For example, the test vibration 232 can be applied with a shaking device, a live environment, a constrained vibration device, or a combination thereof.

Vibration is the motion of an oscillating body about a reference position. Vibration can be a complex combination of signals that describe the physical acceleration and motion of an object. Vibration can be characterized by components of displacement, amplitude, and frequency. In some cases, vibration may include irregular, non-periodic motion, displacement, amplitude, and frequency components. The test vibration 232 can have a vibration amplitude 234, a vibration frequency 236, and a vibration displacement 237.

The vibration amplitude 234 is the measurement of the displacement, velocity, or acceleration of the test vibration 232. The vibration amplitude 234 can have units of meters (m), meters per second (m/s), and meters per second squared (m/s^2). The vibration amplitude 234 can also include a directional component if necessary. The vibration amplitude 234 can be expressed in terms of the peak value or root-mean-square value (rms).

The vibration displacement 237 is the distance between the peaks of the oscillation. The vibration frequency 236 is a measurement of how often the test vibration 232 goes though repeated cycles of movement. The vibration frequency 236 is measured in hertz (Hz). The test vibration 232, such as a vibration environment, can have acceleration peaks of up to 109 gravities (g) and pulse durations of approximately 8.0 milliseconds (ms), The test vibration 232 can also be characterized by velocity changes of up to 544 centimeters/second (214 inches per second), and have an equivalent drop height of 151 centimeters (60 inches). Although the test vibration 232 can be used in a test environment, it is understood that the test vibration 232 can include vibration encountered in normal operational usage in the real world.

The memory module 108 mounted in the memory socket 106 can be oriented in an x-y plane. The x-axis can be oriented along the length of the memory sockets 106. The y-axis can represent height and be oriented along the direction extending from the memory socket 106 to the memory module 108.

3.0 Implementation Mechanisms—System Overview 3.1 Memory Modules

Figure 3:
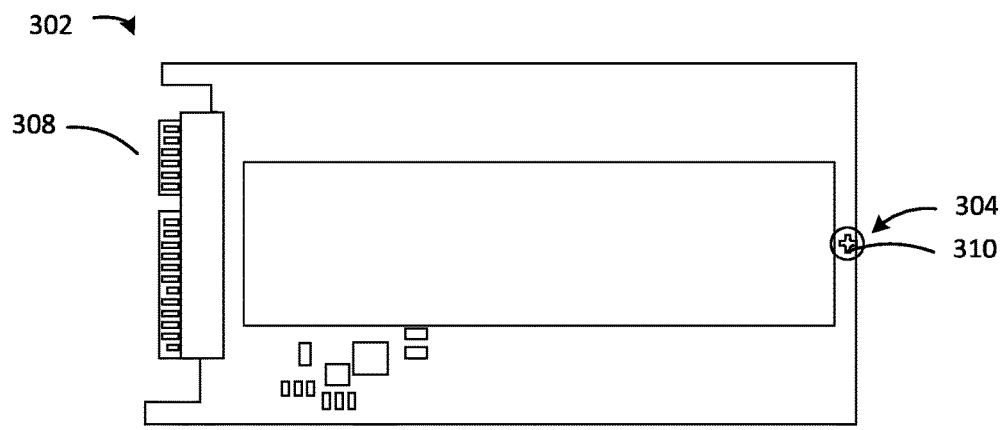
FIG. 3 depicts an embodiment of a memory module with a single fastener mounting point.

FIG. 3 illustrates an embodiment of a memory module 302 with a single fastener mounting point 304. The memory module 302 can be directly attached to the computer system 100 with a connector 308 and the single fastener mounting point 304. The single fastener mounting point 304 can be at the far end of the memory module 302 opposite from the connector 308.

The memory module 302 can be any of a variety of electronic devices including a M.2 SSD memory board (Solid State Drive), DIMM memory boards (Duel Inline Memory Module), SIMM memory boards (Single Inline Memory Module, or other similar devices. The connector 308 can have a variety of configurations. The connector 308 can be a SATA connector, a USB connector, a PATA connector, a PCIe connector, an EUSB (embedded USB) or other similar high-performance memory and communication interfaces.

The single fastener mounting point 304 can attach to the memory module 302 using a fastener 310 such as a screw, rivet, plastic fastener, adhesive, bolt, or a combination thereof. The single fastener mounting point 304 can hold the memory module 302 in place during normal operation.

However, the single fastener mounting point 304 may be insufficient for holding the memory module 302 in place during extreme operation environments such as those with high levels of vibration, tight physical space, variable thermal environments, or a combination thereof. The memory module 302 can deform during regular operation including flexing, bending, bowing, twisting, or a combination thereof.

Such contortions can result in short circuits, bending, breaking, inappropriate physical contact, rubbing, abrasion, or a combination thereof.

In an embodiment, the memory module 302 can be mounted on the circuit board of another board and then mounted in the computer system 100. This can include daughter board configurations, replaceable memory module configurations, or a combination thereof.

Figure 4:
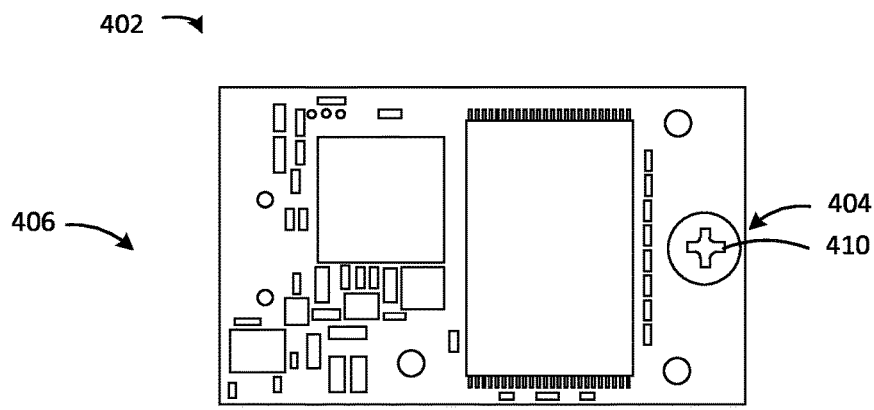
FIG. 4 depicts a view of the memory module attached with a single fastener mounting point.

FIG. 4 illustrates a view of the memory module 402 attached with a single fastener mounting point 404. The memory module 402, such as an EUSB device, can be attached using a connector 406 on a horizontal surface of the memory module 404 and the single fastener mounting point 404. A fastener 410 can be attached at the single fastener mounting point 404 to secure the memory module 402. The memory module 402 is like the previous memory modules and have similar elements and properties.

Retainers

Figure 5:
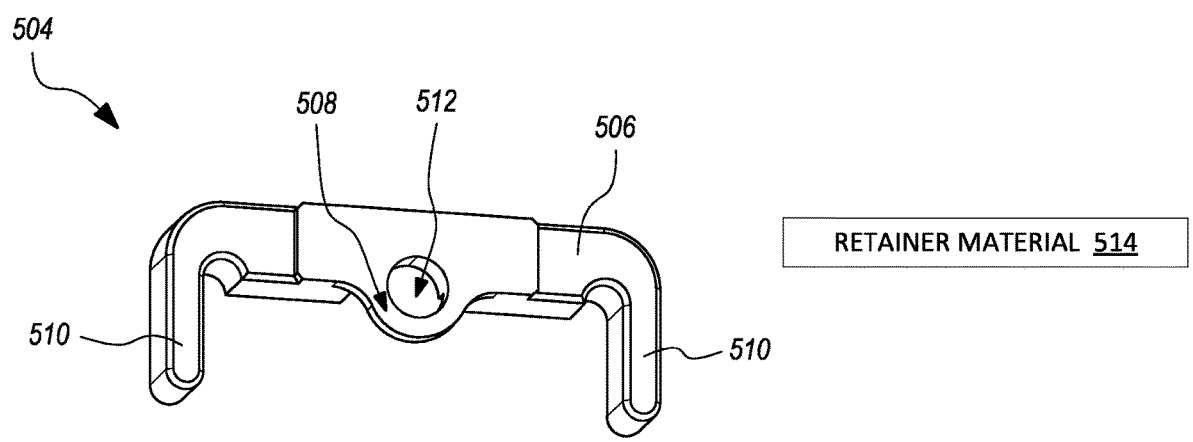
FIG. 5 depicts an exemplary isometric view of an embodiment of a retainer.

FIG. 5 illustrates an exemplary view of an embodiment of a retainer 504. The retainer 504 can be used to securely attach the memory module 402 to the computer system 100.

The retainer 504 can be configured in a variety of ways. In an embodiment, the retainer 504 can include a retainer base 506 having a fastener tab 508, a fastener opening 512, and one or more retainer arms 510.

The retainer base 506 is a structural element that extends across the top of the retainer 504. The retainer base 506 can be attached to the retainer arms 510, such as a left retainer arm and a right retainer arm. The retainer base 506 and the retainer arms 510 can be sized to make direct contact with the memory module 402 for a secure fit. The retainer base 506 can optionally have a retainer slot to help secure the memory module 402.

The retainer arms 510 are structural elements that extend from one or both longitudinal ends of the retainer base 506. The retainer arms 510 and the retainer base 506 can form a C-shape brace that will attach to the memory module 402 on three sides.

The fastener tab 508 is a structural element that extends from the retainer base 506 and includes the fastener opening 508. The fastener opening 512 is sized to accommodate the positioning the fastener 410 within the fastener opening 508 to secure the retainer 504 to the memory module 410. The fastener tab 508 can be positioned on the retainer base 506 to be flush with a front side of the retainer 504. This can allow the fastener tab 508 to overhang the front side of the memory module 402.

The fastener tab 508 can be flush and coplanar with one of the sides of the retainer base 506. Making the fastener tab 508 flush and coplanar allows the fastener tab 508 to be mounted directly on the surface of the memory module 410.

The retainer 504 can be formed from a retainer material 514. The retainer material 514 can be a plastic, metal, alloy, ceramic, epoxy, thermoplastic polymer, polycarbonate, acrylonitrile butadiene styrene, nylon, aluminum, stainless steel, spring steel, other polymer materials, a 3D-printing stock material, or a combination thereof. The retainer 504 can be formed by 3D printing, extrusion, molding, etching, cutting, ablation, assembling, folding, or a combination thereof.

In addition, the retainer 504 can act as a vibration dampening element to reduce the effects of vibration on the memory module 108. The retainer 504 can act as a three-axis vibration damper by reducing vibration along the X, Y, and Z axes. The retainer 504 can reduce vibration by acting like a spring and deforming under vibration or stress. The retainer 504 can couple together the memory module 108, the memory socket 106, and the socket latch 110 to reduce the level of relative motion between the components.

Figure 6:
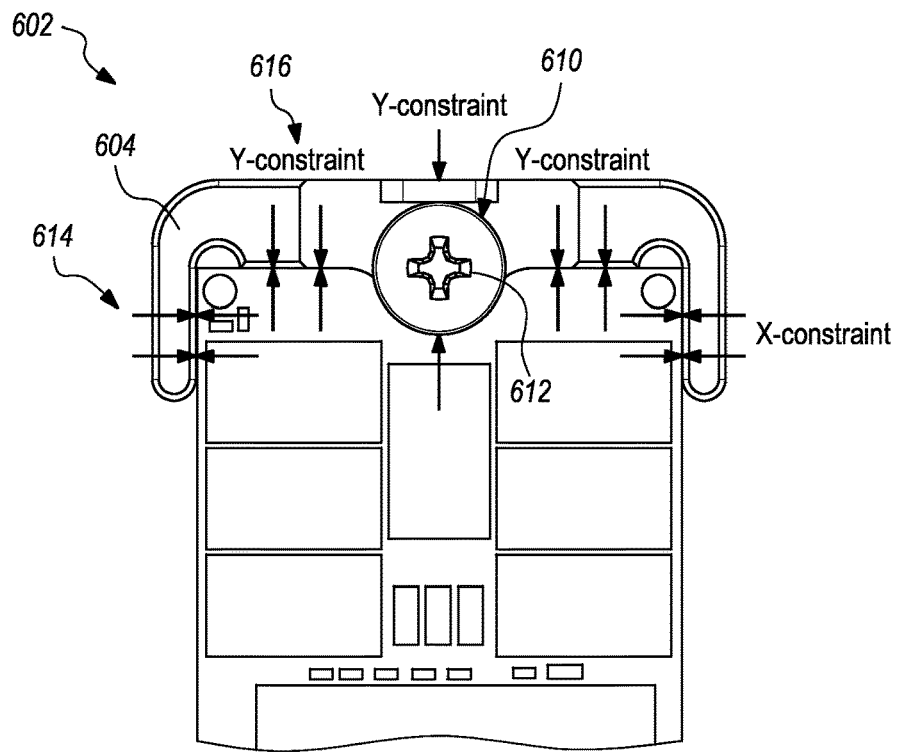
FIG. 6 depicts a top view of a retainer attached to a memory module.

FIG. 6 illustrates a top view of a retainer 604 attached to a memory module 602. The retainer 604 holds the memory module 602 to the computer system 100 via a fastener 610. In an example, the memory module 602 can be a M.2 SSD module.

The retainer 604 can be configured to attach to the memory module 602 in a variety of ways. In some embodiments, the retainer 604 can be a C-shaped mechanical element coupled to the memory module 602 with a fastener 612 at a single fastener mounting point 610. The retainer 604 can also be attached to the memory module 602 along the side of the memory module 602 and the rear end of the memory module 602.

The retainer 604 can be formed from a variety of materials. For example, the retainer 604 can be formed from metal, an alloy, plastic, ceramic, a composite material, aluminum, steel, or a combination thereof.

The retainer 604 can be formed in a variety of ways. For example, the retainer 604 can be formed by stamping, pressing, cutting, molding, three-dimensional printing, or a combination thereof.

The memory module 602 can be oriented in a variety of ways. In an illustrative example, the memory module can be oriented such that the y-direction is along the axis extending from the connector to the single fastener mounting point 610, the x-direction is from side to side of the memory module 602, and the z-direction is perpendicular to the plane formed by the memory module 602. Although the memory module 602 is shown as a DIMM module, it is understood that the direction orientation can apply to other generally flat memory devices and circuit boards.

In an embodiment, the retainer 604 can be attached to both sides of the memory module 602 extending in the x-direction to provide an x-constraint 614. The retainer 604 can apply an inward force toward the center of the memory module 602 from the retainer 610. The retainer 604 can be configured to be slightly smaller than a width of the memory module 602.

The retainer 604 can be attached to the memory module 602 in the y-direction at an end of the memory module 602. The retainer 604 can be attached to the single fastener mounting point 610 with the fastener 612. The retainer 604 can be in direct contact with the memory module 602 at one or more locations along the back side of the memory module 602.

The retainer 604 is attached to the underlying circuit board or motherboard of the computer system 100 with the fastener 612. The retainer 604 can secure and hold the memory module 602 securely relative to the board. Since the retainer 604 can be in direct contact with the memory module 602 at several locations, the retainer 604 can provide stability and support for the memory module 602 in the x-direction, the y-direction, and the z-direction.

In an embodiment, the retainer 604 can act as a mechanical restraint and pairs of forces can be analyzed to show the static equilibrium of the system. For example, the retainer base 506 can exert a force on the memory module 602. The two forces can be a y-constraint 616 and be balanced and equal in a static configuration. Similarly, the retainer arms 614 can exert forces against the sides of the memory module 602 and can be described as an x-constraint 614. When the paired forces of the x-constraint 614 are balance and equal, the system will be in a static equilibrium and not move.

Figure 7:
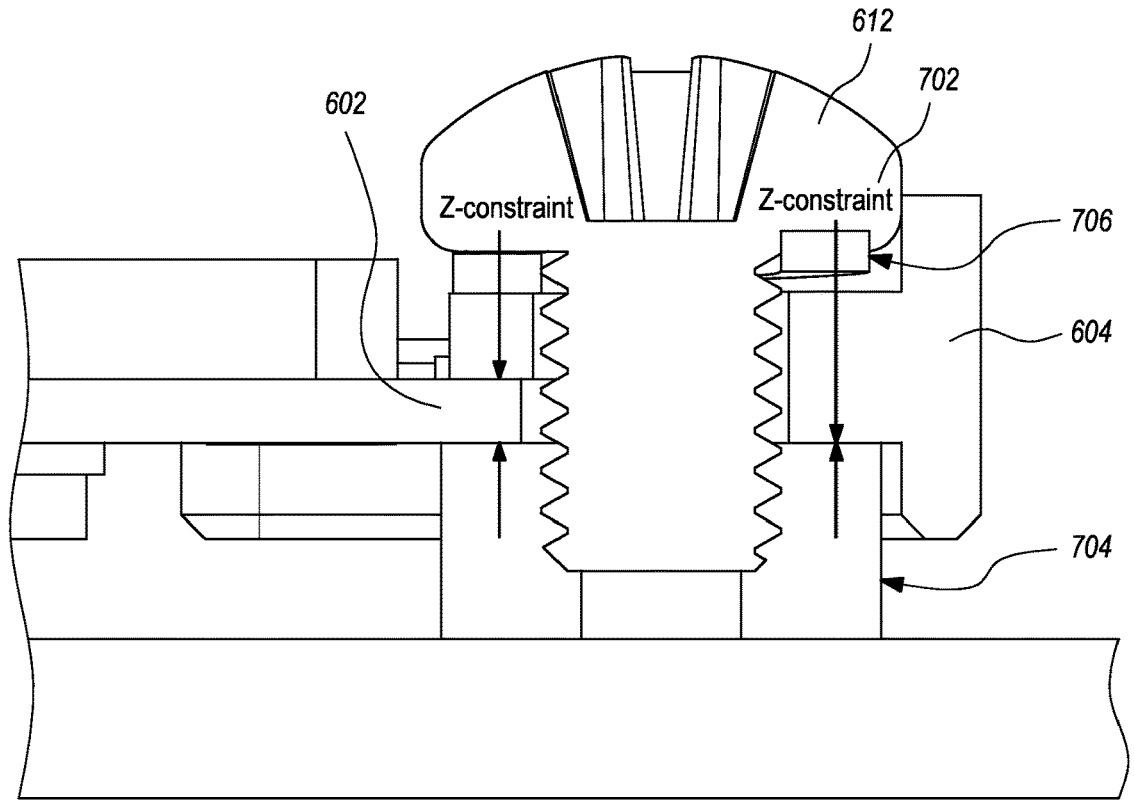
FIG. 7 depicts a side view of the retainer 604 attached to the memory module.

FIG. 7 illustrates a side view of the retainer 604 attached to the memory module 602. The retainer 604 holds the memory module 602 to a circuit board of the computer system 100 via the fastener 612.

In an embodiment, the retainer 604 can be attached to the memory module 602 with the fastener 612 which extends through the retainer 604 and the memory module 602. The fastener 612 can attach or be mounted to a coupling unit 704 such as a coupling nut mounted on the circuit board.

In some embodiments, the fastener 612 can have a washer 706 between a top of the fastener 612 and the retainer 604. The washer 706 is a mechanical element used to keep the fastener from loosening, distribution the load from the fastener over a larger area, provide offset spacing, increasing thermal transfer, or a combination thereof. The washer 706 can be a split washer, a regular washer, a conical washer, a helical spring washer, a toothed washer, or a combination thereof. The washer 706 can act as a spring to compensate for changes in the distance between the head of the fastener 612 and the retainer 604.

The retainer 604 can be configured to be in direct contact on both the top and bottom flat sides of the memory module 602 relative to the z-axis. The head of the fastener 612 can apply force against the side of the retainer 604 to provide a z-constraint to the memory module 602. The retainer 604 can distribute the force applied by the fastener 612 along the interface between the memory module 602 and the retainer 604 for a more secure contact.

The fastener 612 and the washer 706 can exert forces against the coupling unit 704 and the flat sides of the memory module 602. These forces can be described as a z-constraint 702 in the z-direction.

FIG. 8 illustrates a top view of a retainer 804 and the memory module 802. The retainer 804 can be attached to the memory module 802, such as an EUSB device, using a fastener 832. The retainer 802 can reduce motion in the x-direction, the y-direction, and the z-direction.

FIG. 9 illustrates a side view of the retainer 804 and the memory module 802. The retainer 804 can be attached to the memory module 802, such as an EUSB device, using a fastener 832. The retainer 802 can reduce motion in the x-direction, the y-direction, and the z-direction.

Figure 10:
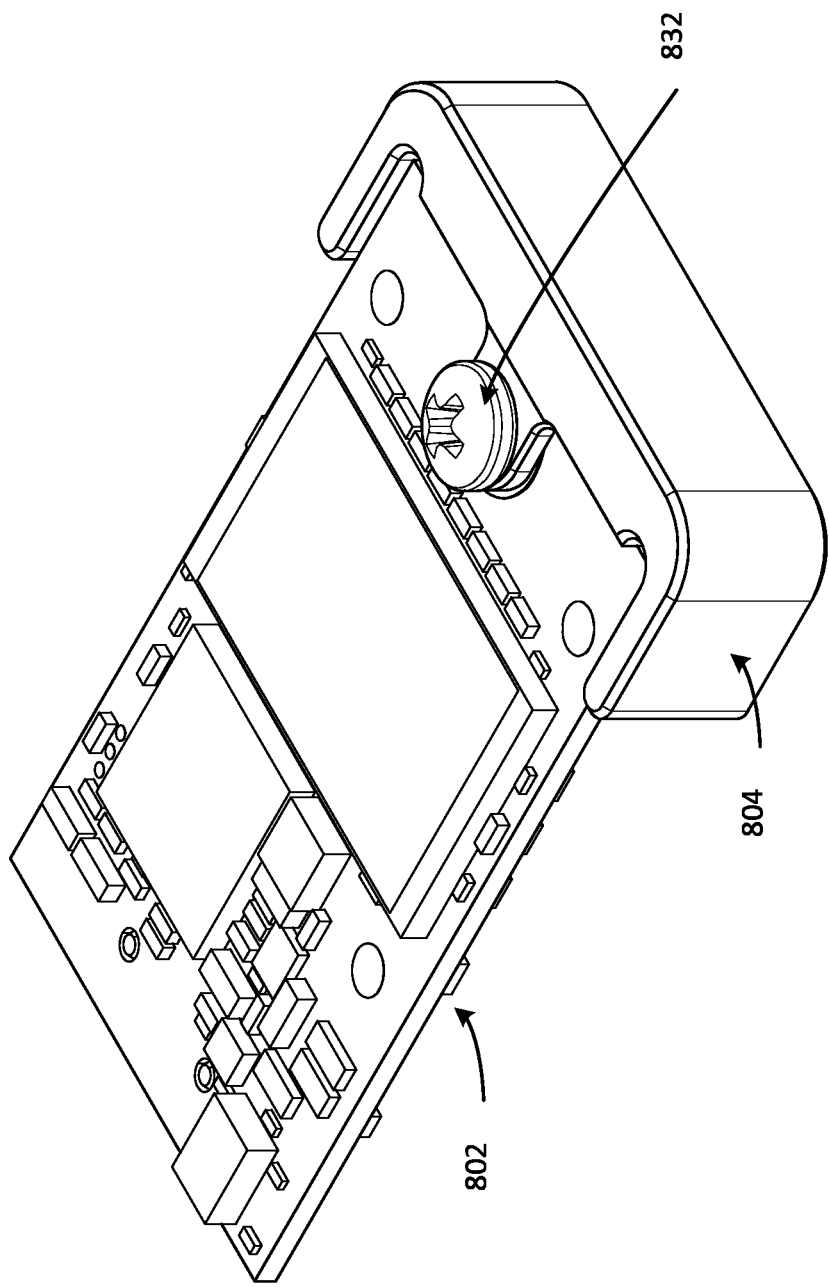
FIG. 10 depicts an isometric view of the retainer and the memory module.

FIG. 10 illustrates an isometric view of the retainer 804 and the memory module 802. The retainer 804 can be attached to the memory module 802, such as an EUSB device, using a fastener 832. The retainer 802 can reduce motion in the x-direction, the y-direction, and the z-direction.

The memory module 802 can be offset from the underlying circuit board by being attached to the retainer 804. The position of the fastener 832 can allow the memory module 802 to be mounted above the circuit board. Alternatively, the memory module 802 can include an additional space (not shown) to support the module and reduce mechanical stress.

Figure 11:
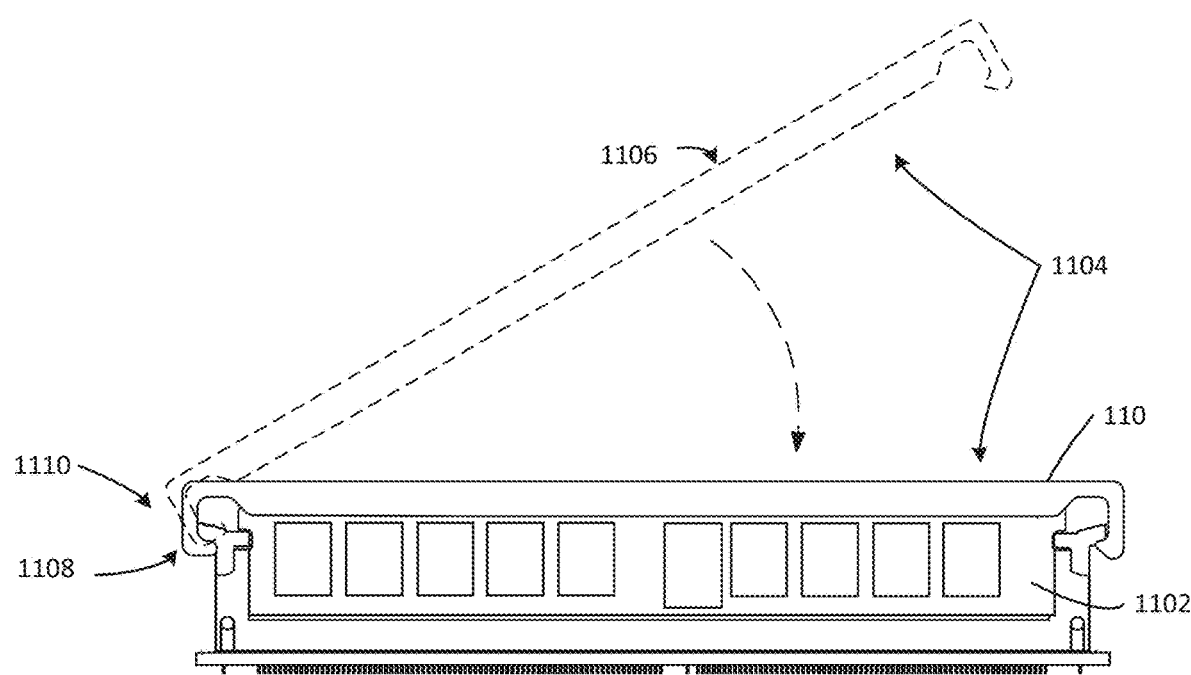
FIG. 11 depicts a front view of the retainer attached to a plurality of memory modules.

FIG. 11 illustrates a front view of the retainer 1104 attached to a plurality of memory modules 1102. The retainer 1104 can be a single integrated unit that can attach to a plurality of the memory modules 1102.

In some embodiments, the retainer 1104 can include a plurality of retainer arms 1110 positioned at the ends of the retainer bases 1106. Each of the retainer arms 1110 can have a retainer tip 1108 that can include an angular portion configured to catch and engage with the latch head bottom side 244 of the socket latches 110. The retainer tips 1108 can have a hook-like or claw-like configuration to engage with the socket latches 110.

In an embodiment, the retainer 1104 can be configured to secure the memory modules 1102 to memory sockets 106 mounted on a circuit board 1118. The retainer 1104 can attach to the socket latches 110 of the memory sockets 106 where the memory modules 1102 are mounted.

The retainer 1104 can be attached to the latch heads 244 on both sides of the memory module 1104 to secure the memory module 1102. The retainer 1104 can attach to the bottom of the latch head bottom side 244 and the latch head outer sides 246. The retainer 1104 is sized to hold the socket latches 110 against the memory module 1104 to secure the memory module 1104 in the memory sockets 106.

The retainer 1104 can provide horizontal stability by applying an inward force on the latch head outer sides 246 to hold the latch heads 242 against the memory module 1102. This holds the socket latches 110 in place and prevents the socket latches 110 from loosening from the memory module 1102.

The retainer 1104 provides vertical stability by clipping the retainer tip 1108 under the latch head bottom sides 244 of the socket latches 110. The retainer tip 1108 can hook underneath the socket latches 110 and hold the memory module 1102 in place vertically.

In an embodiment, the retainer tips 1108 of one side of the retainer arms 1110 can be engaged under the socket latches 110 with the retainer 1104 at an angle to the memory module 1102. After the first side of the retainer 1104 has been secured, the other side of the retainer 1104 can be pressed down to engage the other set of the retainer arms 1110 to the other set of the socket latches 110.

Figure 12:
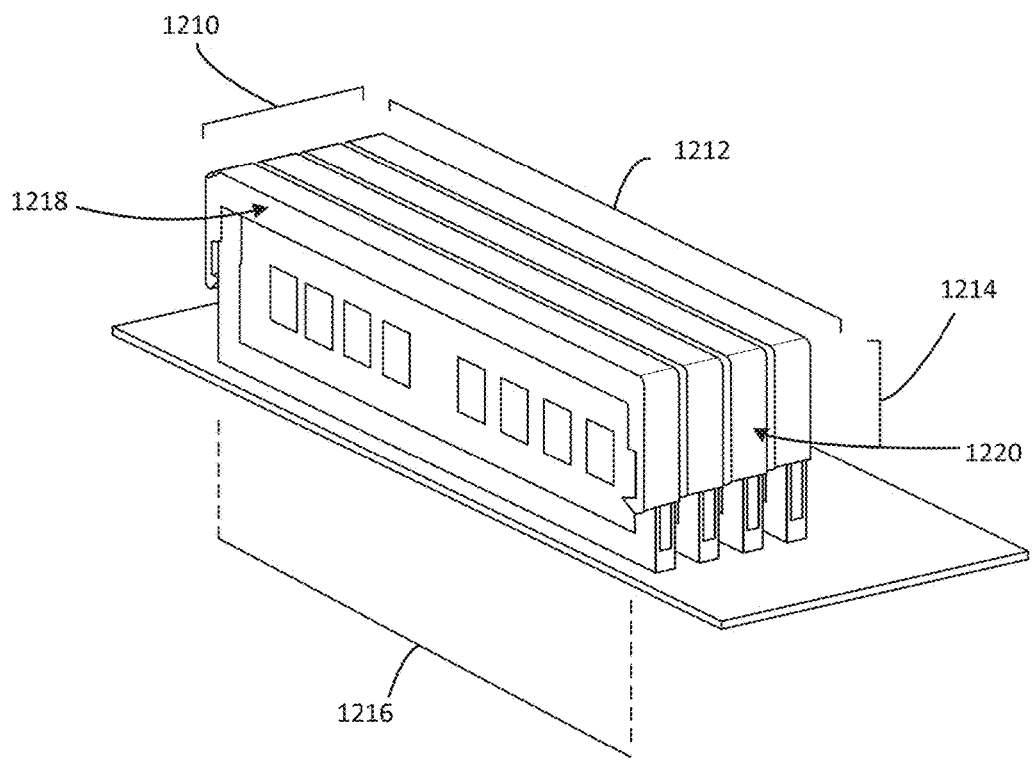
FIG. 12 depicts an exemplary isometric view of the retainer attached to the plurality of memory modules.

FIG. 12 illustrates an exemplary isometric view of the retainer 1104 attached to the plurality of memory modules 1102. The retainer 1104 can be a single integrated unit that can attach to a plurality of the memory modules 1102.

The retainer 1104 can have a variety of configurations. In an embodiment, the retainer 1104 can have a retainer width 1210 approximately equivalent to the width of the number of the memory modules 1102 and the memory sockets 106. In an embodiment, this can be approximately the same width as three individual retainers sized for a single one of the memory modules 1102.

The retainer 1104 can have a retainer length 1212 and a retainer inner length 1216. The retainer length 1212 is the length of the retainer base 1106 measured from the end of each of the retainer arms 1110. The retainer inner length 1214 is the length of the inner side of the retainer 1104.

The retainer 1104 can have a retainer height 1214. The retainer height 1214 can be the height of the retainer arms 1110 of the retainer 1104. The retainer height 1214 can be expressed as the distance from a top side of the retainer base 1106 to a bottom of the retainer tip 1108.

The retainer 1104 can include retainer surface openings 1218 and retainer side openings 1220. The retainer surface opening 1218 can have a variety of configurations. In some embodiments, the retainer surface openings 1218 can be linear openings running the length of the retainer. In another embodiment, the retainer surface openings 1218 can have shapes configured to allow warmer air to escape from the chips of the memory module 1102 and through the retainer surface openings 1218 using convection.

In another embodiment, the retainer 1104 can be an electromagnetic interference shield layer having minimal retainer surface openings 1218. In this configuration, the retainer 1104 can be formed from a conductive material and the retainer 1218 can be electrically grounded.

In yet another embodiment, the retainer 1104 can include retainer side openings 1220. The retainer side openings 1220 can be positioned at the ends of the retainers 1104 adjacent to the socket latches 110. The retainer side openings 1220 can be configured to have shapes that allow the flow of air away from the memory modules 1102 to allow additional cooling and thermal transfer. In another embodiment, the retainer 1104 can be formed from a conductive material and act as a retainer side opening 1220 can have a minimum size configuration.

In an embodiment, using a quad retainer having four retainer units can simplify operation for large memory subsystems and reduce the time needed to install and test. Further, the regular spacing of the retainer surface openings 1218 can allow for adequate cooling and thermal transfer to avoid overheating.

FIG. 13 illustrates an exemplary isometric view of a retainer 1304 attached to the plurality of memory modules 1302. The retainer 1304 can be a single integrated unit that can attach to a set of four of the memory modules 1302 and memory sockets 106.

In an embodiment, the retainer 1304, such as a quad retainer, can be mounted over the four of the memory modules 1302. The retainer 1304 can have a width wide enough to cover each of the memory modules 1302. The retainer 1304 can be attached to the socket latches 110 of the memory sockets 106 which are mounted on the underlying circuit board of the computer system 100. The retainer 1304 can hold the memory modules 1302 in place when the system is experiencing vibration or other high dynamic loads.

The retainer 1304 can include a retainer base 1308 and retainer arms 1310. The retainer arms 1310 can have a lever latch 1312 attached to latch joint 1314.

The retainer 1302 can have a variety of configurations. For example, the retainer 1304 can be attached to and over the memory modules 1102. The retainer 1104 can be a single integrated unit, a set of linked single module sized units, or a combination thereof. When the retainer 1304 is a single unit, then the retainer 1304 can be attached to the memory modules 1302 in a single operation, thus reducing installation time. The retainer 1304 can be formed as a combination of a single and multiple retainers.

The retainer 1302 can have lever latches 1308 attached to the retainer arms 1310. The lever latches 1308 are mechanical elements connected to the retainer arms 1310 at lever joints 1314. The lever latches 1314 can include an upper latch arm 1318 and a lower latch arm 1320 separated with the lever joint 1314. The lever joint 1314 can be attached to the retainer arms 1314 and can act as a fulcrum for the lever latch 1314.

The lever latches 1314 can attach and secure the lever latch tip 1316 with the latch head bottom side 244 of the memory socket 106. The lever latch tip 1316 is a mechanical element that interlocks with the latch head bottom side 244 to hold the retainer 1304 in place vertically. In an embodiment, the lever latch tip 1316 can be an angular element like a hook tip that can engage with the latch head bottom side 244.

In a removal example, the latch upper arm 1318 can be pressed inward toward the center of the retainer 1304 and the latch lower arm 1320 can move outward allowing the lever latch tip 1316 to disengage from the latch head bottom side 244. Once disengaged, the retainer 1304 can be removed from the memory module 1302.

FIG. 14 illustrates a front view of the memory module 1302 secured with the retainer 1304. The retainer 1304 can provide retention for the memory module 1302 in the x-direction, the y-direction, and the z-direction.

In an embodiment, the retainer 1304 can be retained in the x-direction by the retainer arms 1310 attached to the retainer base 1308. The retainer 1304 can be retained in the y-direction using the lever latch tip 1316 attached to the socket latch 110. The lever latch tip 1316 is on the bottom side of the lower latch arm 1320. The lever latch tip 1316 can engage with the socket latch 110 to prevent motion in the y-direction. The retainer 1304 can be retained in the z-direction with the memory module 1302 inserted into a slot of the retainer 1304.

Figure 15:
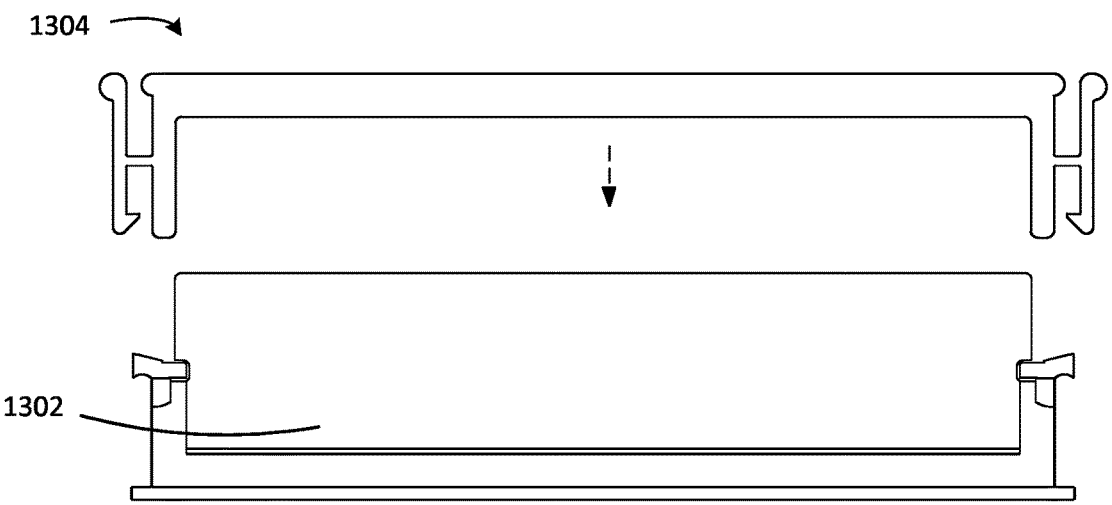
FIG. 15 depicts an exemplary view of the memory module 1302 with the retainer 1304 in an attachment stage.

FIG. 15 illustrates an exemplary view of the memory module 1302 with the retainer 1304 in an attachment stage. The retainer 1304 can be positioned above the memory module 802, such as a DIMM memory module.

Figure 16:
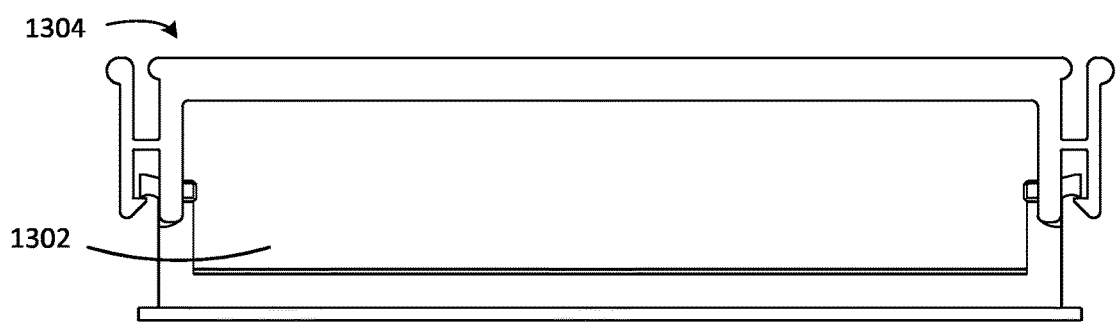
FIG. 16 depicts an exemplary view of the memory module 1302 with the retainer 1304 in a locked stage.

FIG. 16 illustrates an exemplary view of the memory module 1302 with the retainer 1304 in a locked stage. The retainer 802 can be directly on the memory module 802 with the lever latch tip 1316 engaged with the socket latch 110.

Figure 17:
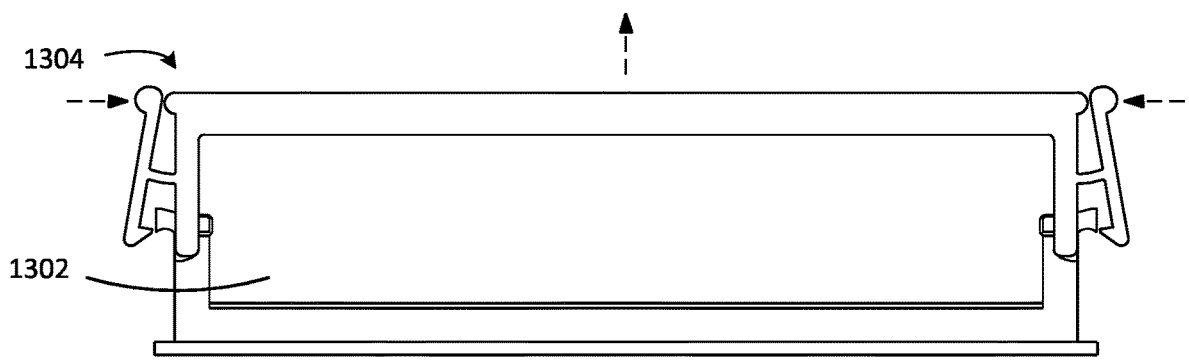
FIG. 17 depicts an exemplary view of the memory module 1302 with the retainer 1304 in a removal stage.

FIG. 17 illustrates an exemplary view of the memory module 1302 with the retainer 1304 in a removal stage. The retainer 1302 can be removed from the memory module 1302 by first pressing inward on the lever latches 1312 which can cause the lever latch tip 1316 to disengage from the memory socket 1306 and then lifting the retainer 1304 vertically.

Figure 18:
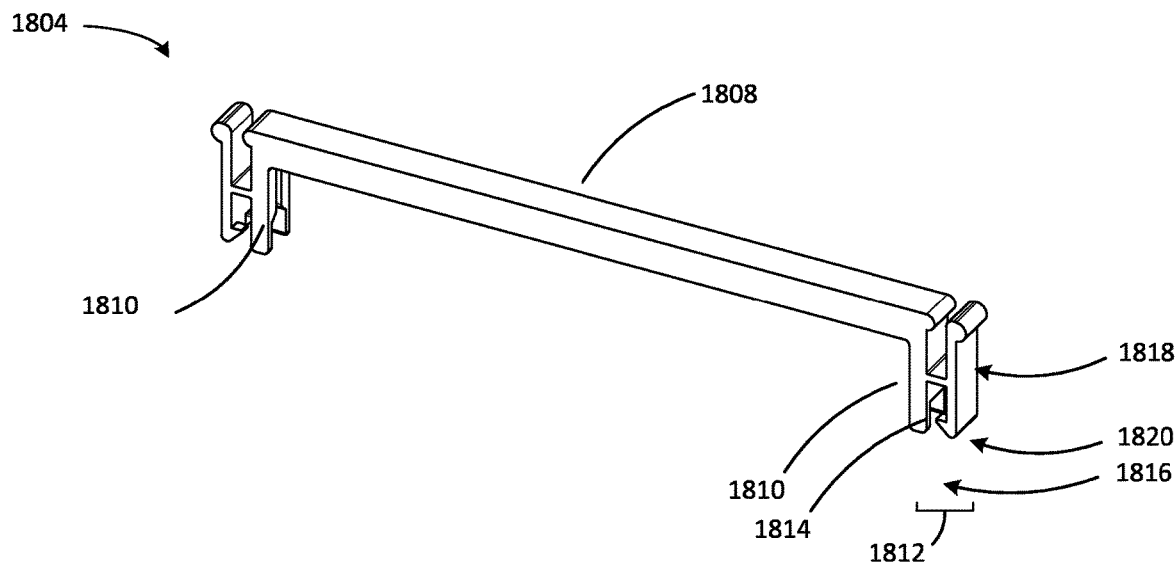
FIG. 18 depicts an exemplary isometric view of a retainer.

FIG. 18 illustrates an exemplary isometric view of a retainer 1804. The retainer 1804, such as a single retainer, is a retention device sized for a single memory module.

The retainer 1804 can have a variety of embodiments. In an embodiment, the retainer 1804 can have a retainer base 1808 with retainer arms 1810 at each end. Each of the retainer arms 1810 can have a latch joint 1814 of a lever latch 1812 attached to each of the retainer arms 1810.

The lever latch 1812 can have an upper latch arm 1818 and a lower latch arm 1820 joined at the latch joint 1814. The lower latch arm 1820 can have a lever latch tip 1816. The lever latch tip 1816 is for engaging with the socket latches 110 of the memory socket 1806.

The latch joint 1814 can act as a fulcrum for the lever latch 1812. Pressing inward on the upper latch arm 1818 can cause the lower latch arm 1820 to move outward.

The retainer 1804 can be attached to the plurality of memory modules 1302. The retainer 1804 can be a single integrated unit that can attach to a set of four of the memory modules 1302 and memory sockets 1056.

The lever latch 1812 can engage and secure the lever latch tip 1816 with the latch head bottom side 244 of the memory socket 106. The lever latch tip 1816 is a mechanical element that interlocks with the latch head bottom side 244 to hold the retainer 1804 in place vertically. In an embodiment, the lever latch tip 1816 can be an angular element like a tooth or hook tip that can engage with the latch head bottom side 244.

Although the lever latch 1812 is shown, it is understood that other latching mechanisms can be used. The latching mechanisms can be configured to allow interaction with the retainer 1804 to more securely retain the memory module being used.

Figure 19:
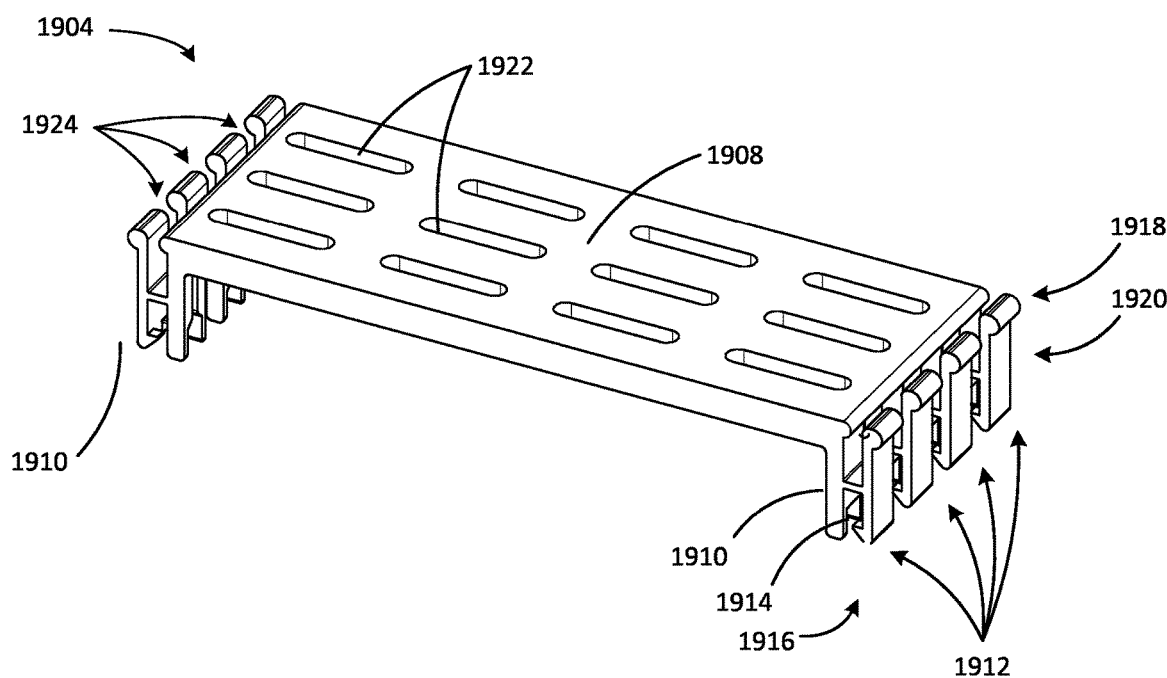
FIG. 19 depicts an exemplary isometric view of a retainer.

FIG. 19 illustrates an exemplary isometric view of a retainer 1904. The retainer 1904, such as a quad retainer, is a retention device sized for four of the memory modules.

The retainer 1904 can have a variety of embodiments. In an embodiment, the retainer 1904 can have a retainer base 1908 with one or more retainer arms 1910 at each end. In another embodiment, the retainer 1904 can be configured with each of the retainer arms 1910 having a latch joint 1914 of a lever latch 1912.

The lever latch 1912 can have an upper latch arm 1918 and a lower latch arm 1920 with the latch joint 1914 between them. The lower latch arm 1920 can have a lever latch tip 1916.

The latch joint 1914 can act as a fulcrum for the lever latch 1912. Pressing inward on the upper latch arm 1918 can cause the lower latch arm 1920 to move outward and release the retainer 1904.

The retainer 1904 can be attached to the plurality of memory modules 1302. The retainer 1904 can be a single integrated unit that can attach to a set of four of the memory modules 1902 and memory sockets 1906.

The lever latch 1912 can engage and secure the lever latch tip 1916 with the latch head bottom side 244 of the memory socket 106. The lever latch tip 1916 is a mechanical element that interlocks with the latch head bottom side 244 to hold the retainer 1904 in place vertically. In an embodiment, the lever latch tip 1916 can be an angular element like a tooth or hook tip that can engage with the latch head bottom side 244. In another embodiment, one of the lever latch tip 1916 can be blunt, while the other side can be configured with the lever latch tip 2016. In an embodiment, the lever latch 2012 can be configured as four single lever latches, two double lever larches, a four-wide lever latch 2012, or a combination thereof.

In yet another embodiment, the retainer base 1908 can be configured in a variety of ways. The retainer base 1908 can be configured as four single module width units, two double module width units, a quad module width unit, or a combination thereof.

The retainer base 1908 can be configured with retainer surface openings 1922. The retainer 1904 can include retainer surface openings 1922 and retainer side openings 1924. The retainer surface opening 1922 can have a variety of configurations. In some embodiments, the retainer surface openings 1922 can be linear openings running the length of the retainer. In another embodiment, the retainer surface openings 1922 can have shapes configured to allow warmer air to escape from the chips of the memory module 1102 and through the retainer surface openings 1922 using convection.

In another embodiment, the retainer 1904 can be an electromagnetic interference shield layer having minimal retainer surface openings 1922. In this configuration, the retainer 1904 can be formed from a conductive material and the retainer 1922 can be electrically grounded.

In yet another embodiment, the retainer 1904 can include retainer side openings 1220. The retainer side openings 1924 can be positioned at the ends of the retainers 1904 adjacent to the socket latches 110. The retainer side openings 1220 can be configured to have shapes that allow the flow of air away from the memory modules 1102 to allow additional cooling and thermal transfer. In another embodiment, the retainer 1904 can be formed from a conductive material and act as a retainer side openings 1220 can have a minimum size configuration.

Figure 20:
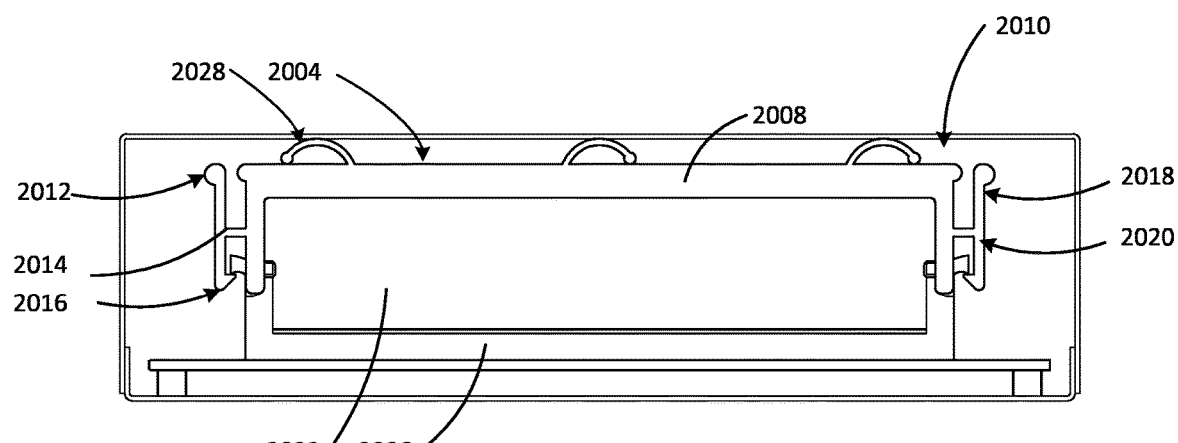
FIG. 20 depicts an exemplary front view of a retainer and a memory module within a housing.

FIG. 20 illustrates an exemplary front view of a retainer 2004 and a memory module 2002 within a housing 2026. The housing 2026 can provide a protective casing for the memory module 2002.

In an embodiment, the retainer 2004 can include flexible spacers 2028 to help securely retain the memory modules 2002 in memory sockets 2006. The flexible spacers 2028 are flexible mechanical element between the retainer 2004 and the housing 2026. The flexible spacers 2028 can act as a spring element to press the retainer 2004 against the memory module 2002 to secure the memory module 2002 firmly in the memory sockets 2006. The flexible spacers 2028 can be angled springs, flat spring, strip prints, or other flexible metal spring elements.

The flexible spacer 2028 can be attached to the retainer base 2008. The retainer 2004 can include one or more of the flexible spacers 2028 attached to the retainer base 2008. The flexible spacers 2028 can help control the distance between the retainer 2004 and the housing 2026.

The flexible spacer 2028 can have a variety of configurations. The flexible spacers 2028 can be shaped flat, angular, rounded, bowed, arched, or a combination thereof. The flexible spacers 2028 can be formed from a variety of materials. For example, the flexible spacers 2028 can be formed from aluminum, steel, copper, alloys, plastic, or a combination thereof.

The housing 2026 can have a variety of embodiments. For example, the housing 2026 can surround the computer system 100, a memory module subsystem, or a combination thereof.

In an embodiment, the housing 2026 can be formed from one or more pieces. The housing 2026 can provide a protective shield from environmental factors. Alternatively, the housing 2026 can include openings to facilitate air flow for cooling purposes.

The housing 2026 can be formed from a variety of materials. For example, the housing 2026 can be formed from metal, alloy, plastic, thermoplastic, resin, ceramic, composite materials, or a combination thereof.

In some embodiments, the housing 2026 can be electrically conductive and form an electromagnetic interference shield. The housing 2026 can be electrically connected to the retainer 2004 using the flexible spacer 2028.

The retainer 2004 can have a variety of embodiments. For example, the retainer 2004 can have a retainer base 2008 and retainer arms 2010 attached at opposite ends of the retainer base 2008.

Each of the retainer arms 2008 can be attached to a lever latch 2012 with a latch joint 2014. The lever latch 2012 can have an upper latch arm 2018 and a lower latch arm 2020 joined at the latch joint 2014. The latch joint 2014 can act as a fulcrum such that pressing the upper latch arm 2018 inward pushes the lower latch arm 2020 outward and releases from the memory module 2002.

Figure 21:
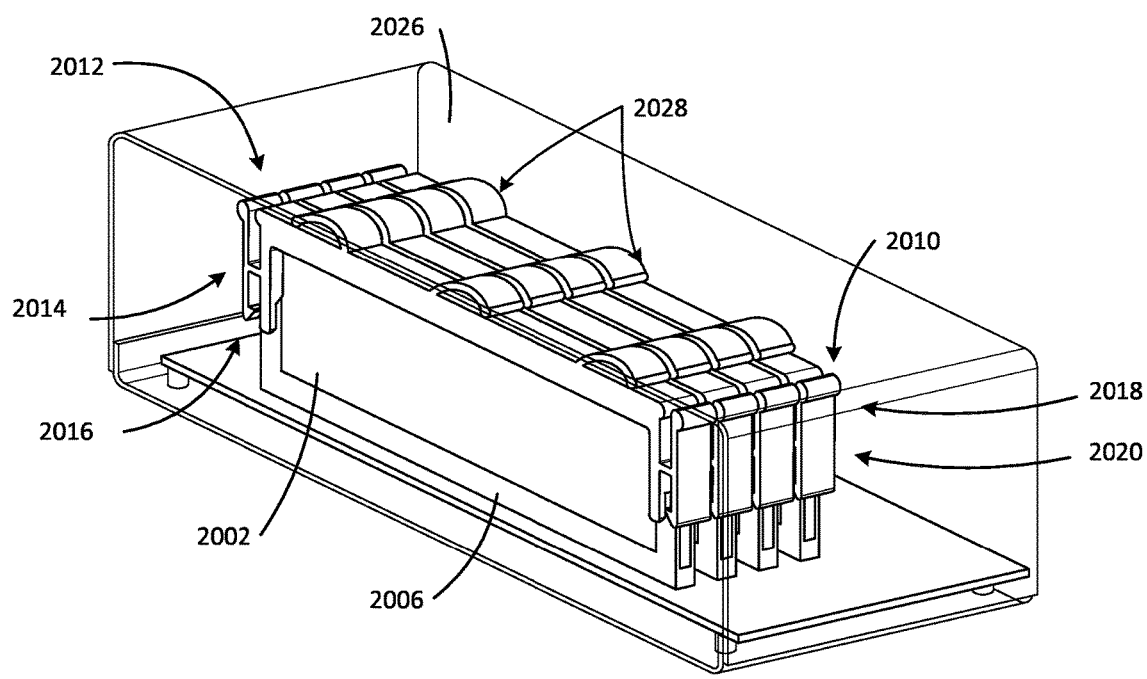
FIG. 21 depicts an exemplary isometric view of the retainer and a memory module within the housing.

FIG. 21 illustrates an exemplary isometric view of the retainer 2004 and a memory module 2002 within the housing 2026. The housing 2026 can provide a protective casing for the memory module 2002.

In an embodiment, the retainer 2004 can include the flexible spacers 2028 to help securely retain the memory modules 2002 in memory sockets 2006. The flexible spacers 2028 are flexible mechanical element between the retainer 2004 and the housing 2026. The flexible spacers 2028 can act as a spring element to press the retainer 2004 against the memory module 2002 to secure the memory module 2002 firmly in the memory sockets 2006. The flexible spacers 2028 can be angled springs, flat spring, strip prints, or other flexible metal spring elements.

The flexible spacer 2028 can be attached to the retainer base 2008. The flexible spacers 2028 can help control the distance between the retainer 2004 and the housing 2026.

The flexible spacer 2028 can have a variety of configurations. The flexible spacers 2028 can be shaped flat, angular, rounded, bowed, arched, or a combination thereof. The shape of the flexible spacers 2028 can be configured to adjust the spacing between the retainer 2004 and the housing 2028.

The flexible spacers 2028 can be formed from a variety of materials. For example, the flexible spacers 2028 can be formed from aluminum, steel, copper, alloys, plastic, or a combination thereof.

The housing 2026 can have a variety of embodiments. For example, the housing 2026 can surround the computer system 100, a memory module subsystem, or a combination thereof.

In an embodiment, the housing 2026 can be formed from one or more pieces. The housing 2026 can provide a protective shield from environmental factors. Alternatively, the housing 2026 can include openings to facilitate air flow for cooling purposes.

The housing 2026 can be formed from a variety of materials. For example, the housing 2026 can be formed from metal, alloy, plastic, thermoplastic, resin, ceramic, composite materials, or a combination thereof.

In some embodiments, the housing 2026 can be electrically conductive and form an electromagnetic interference shield. The housing 2026 can be electrically connected to the retainer 2004 using the flexible spacer 2028.

The retainer 2004 can have a variety of embodiments. For example, the retainer 2004 can have a retainer base 2008 and retainer arms 2010 attached at opposite ends of the retainer base 2008.

Each of the retainer arms 2008 can be attached to a lever latch 2012 with a latch joint 2014. The lever latch 2012 can have an upper latch arm 2018 and a lower latch arm 2020 joined at the latch joint 2014. The latch joint 2014 can act as a fulcrum such that pressing the upper latch arm 2018 inward pushes the lower latch arm 2020 outward and releases from the memory module 2002.

Figure 22:
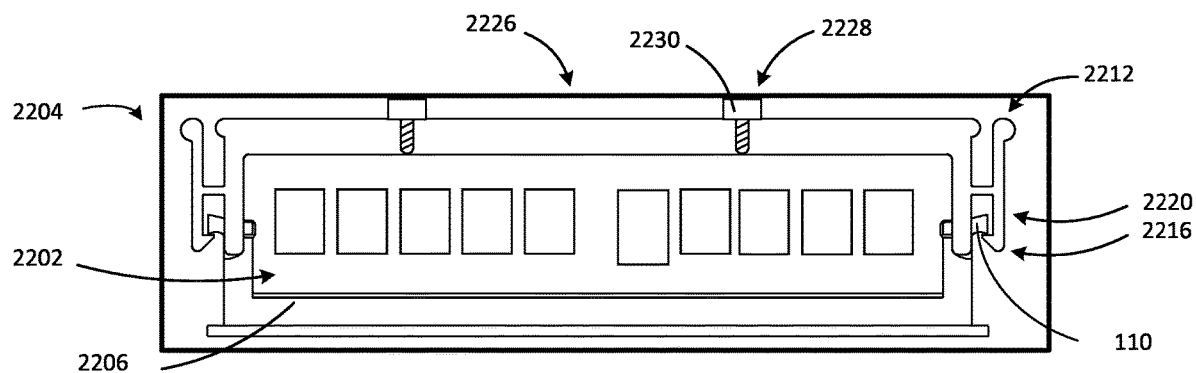
FIG. 22 depicts a front view of the retainer secured to a memory module with a socket cap screw.

FIG. 22 illustrates a front view of the retainer 2204 secured to a memory module 2202 with a socket cap screw 2228. The socket cap screw 2228 can act as a spacer between the retainers 2204 and a housing 2226.

In an embodiment, the retainer 2204 can be attached to the memory module 2202 and secured in position using the socket cap screw 2228. The socket cap screw 2228 is a mechanical component, such as a machine screw, having a socket cap head 2230. The socket cap head 2230 can be a cylindrical barrel cap with a hexagonal socket to facilitate a smaller diameter of the socket cap head 2230. Alternatively, the socket cap screw 2228 can be described as a socket head cap screw, a cap head socket screw, or a hex socket head screw.

The socket cap screw 2228 can be installed in the retainer 2204 such that the socket cap head 2230 extends above a top of the retainer 2204. The protrusion of the socket cap head 2230 can provide a spacing between the retainer 2204 and the housing 2226.

In some embodiments, the housing 2226 can be used to form an electromagnetic interference shield. The housing 2226 can be electrically connected to the socket cap head 2230 which can further be connected to an electrical ground.

In other embodiments, the socket cap screw 2228 can dissipate heat from the memory module 2202 by forming a thermally conductive path from the memory module 2202 to the housing 2226. The retainer 2204 can be attached to the memory module 2204. The heat generated by the memory module 2204 can be transferred to the retainer 2204 and then to the housing 2226 via the socket cap screw 2228 in direct contact with the housing 2226.

Figure 23:
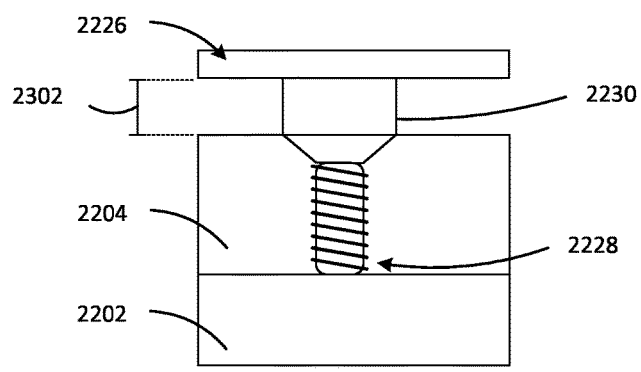
FIG. 23 depicts a cutaway view of the retainer and the socket cap screw.

FIG. 23 illustrates a cutaway view of the retainer 2204 and the socket cap screw 2228. The socket cap screw 2228 can be attached to the retainer 2204 and in direct contact with the housing 2226.

In an embodiment, the socket cap screw 2228 can be affixed to the retainer 2204 and extend down to be in direct contact with the memory module 2202. The pressure of the socket cap screw 2228 against the top of the memory module 2202 can improve retention of the memory module 2202 and improve stability of the module.

The socket cap head 2230 can be coplanar with the top of the retainer 2004 and an interior bottom side of the housing 2226. A top side of retainer 2204 can be separated from the interior bottom side of the housing 2226 by a head height 2302 of the socket cap screw 2228.

Figure 24:
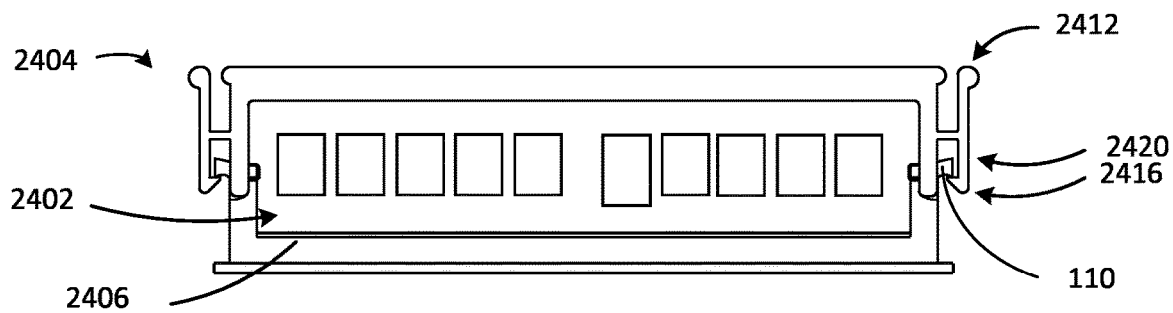
FIG. 24 depicts a front view of the retainer and the memory module in an embodiment.

FIG. 24 illustrates a front view of the retainer 2204 and the memory module 2402 in an embodiment. The retainer 2404 can be attached to the memory module 2402 with the retainer base 2408 and retainer arms 2410 directly on the memory module 2402. The retainer 2404 can include a retainer base 2408, retainer arms 2410, and lever latches 2412. The lever latches 2412 can include latch joints 2414, upper latch arms 2418, lower latch arms 2418, and a lever latch tip 2416 for attaching to the memory sockets 2406.

Figure 25:
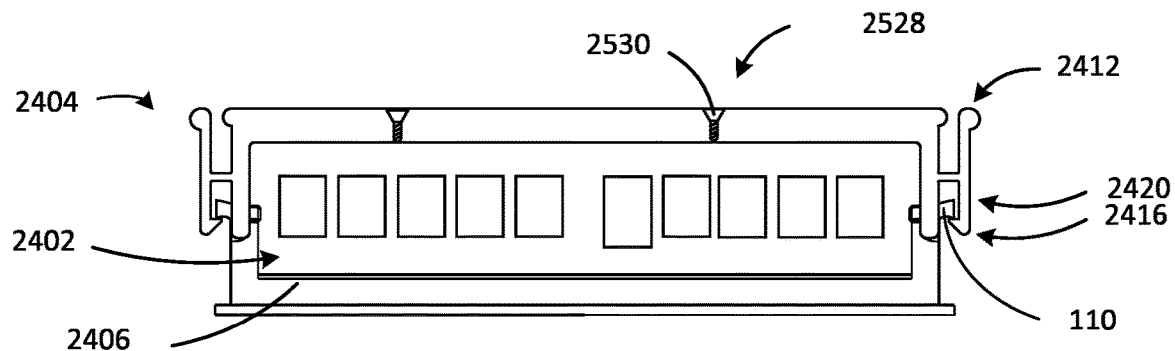
FIG. 25 depicts a front view of the retainer secured to the memory module in an embodiment.

FIG. 25 illustrates a front view of the retainer 2404 secured to the memory module in an embodiment, the retainer 2404 can be attached to the memory module 2402 and secured in position using the flushed screw 2528. The flushed screw 2528 is a mechanical component, such as a machine screw, having a flat head 2530 and a conical head body. The flushed screw head 2530 can be a conical cap with a hexagonal, straight, or Phillips' head screw head.

The socket cap screw 2428 can be installed in the retainer 2404 such that the socket cap head 2430 extends above a top of the retainer 2404. The protrusion of the socket cap head 2430 can provide a spacing between the retainer 2404 and the housing 2426.

In other embodiments, the socket cap screw 2428 can dissipate heat from the memory module 2402 by forming a thermally conductive path from the memory module 2402 to the housing 2426. The retainer 2404 can be attached to the memory module 2404. The heat generated by the memory module 2404 can be transferred to the retainer 2404 and then to the housing 2426 via the socket cap screw 2428 in direct contact with the housing 2426.

Figure 26:
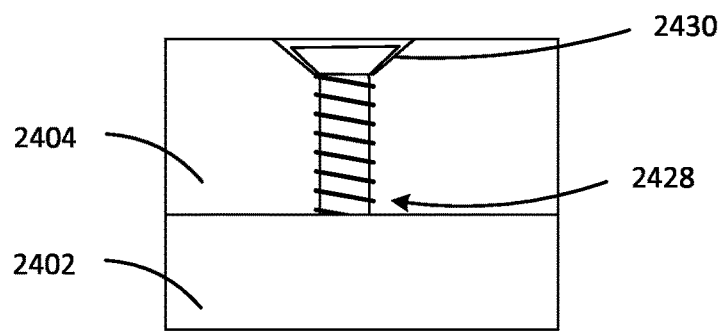
FIG. 26 depicts a cutaway view of the retainer and the socket cap screw.

FIG. 26 illustrates a cutaway view of the retainer 2404 and the flushed screw 2428. The slushed screw 2428 can be attached to the retainer 2404 and in direct contact with the memory module 2402 to help secure the memory module 2402 in place.

Figure 27:
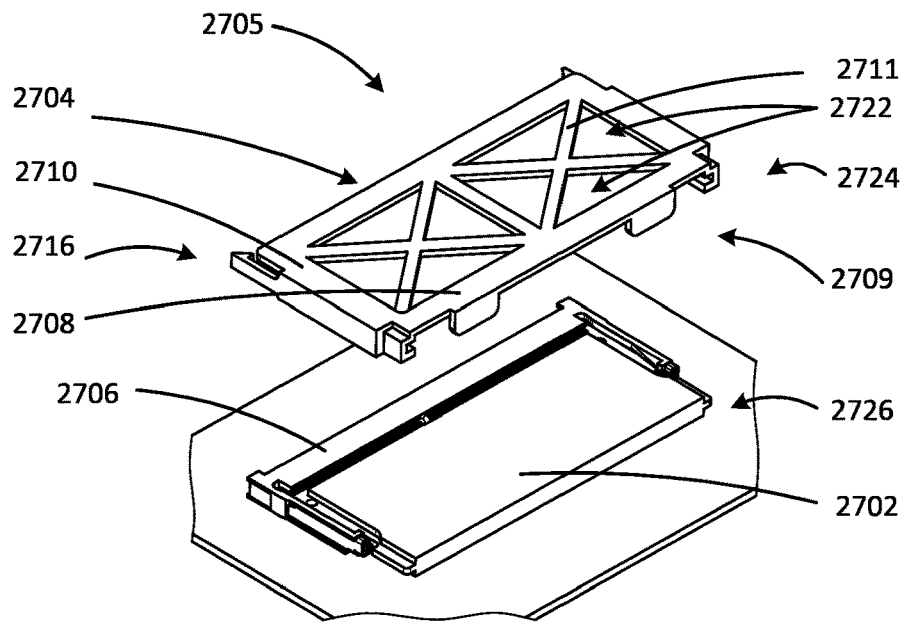
FIG. 27 depicts an example of a placement step of attaching a retainer to a memory module.

FIG. 27 illustrates an example of a placement step of attaching a retainer 2704 to a memory module 2702. The retainer 2704 can be configured for the type of the memory module 2702. The memory module 2702 can be any of a variety of memory types. For example, the memory module 2702 can be a SO-DIMM memory module mounted flat on a circuit board.

In an embodiment, the retainer 2704 can include a retainer frame 2705 formed with retainer bases 2708 and retainer arms 2710. The retainer bases 2708 can be horizontally oriented and the retainer arms 2710 can be vertically oriented.

The retainer arms 2710 can each have a retainer slot 2724 on the inner side of the retainer arms 2710. The memory modules 2702 can be configured with a module tongue 2726 that fits into the retainer slots 2724 to limit motion in the z-direction.

The retainer 2704 can include retainer ribs 2711 extending between the joints between the retainer bases 2708 and the retainer arms 2710. The retainer ribs 2711 can have a variety of configuration. For example, the retainer ribs 2711 can form two X-shaped windows in the retainer 2704. The retainer ribs 2711 can form a lightweight mechanical structure and provide stability with a lower amount of material. The retainer ribs 2711 can help reduce motion in the z-direction because the retainer ribs 2711 are coupled to the tongue-in-groove joint formed by the retainer slot 2724 and the module tongue 2726 of the memory module 2702.

The retainer 2704 is a structural element for maintaining the position of the memory module 2702 in place in a memory socket 2706. The retainer 2704 can hold the memory module 2702 in the memory socket 2706 during dynamic environmental conditions such as high vibration or other mechanical stresses.

The retainer 2704 can include a lever latch 2712. The lever latch 2712 can be positioned at the ends of each of the retainer arms 2710. The lever latch 2712 can be attached to the retainer arm 2710 at a latch joint 2714. The lever latch 2712 can be flexible and can flex to maintain a good connection with the memory socket 2706.

The lever latch 2712 can include at lever latch tip 2716 at the end of the lever latch 2712. The lever latch tip 2716 can be an angular mechanical element that can flexibly engage with the memory socket 2706 to lock the retainer 2704 to the memory socket 2706. The lever latch tip 2716, such as a hook, can lock to the body of the memory socket 2706 on both sides of the memory module 2702 and the memory socket 2706.

The retainer 2704 can have one or more retainer tabs 2709 attached to the end of one of the retainer bases 2708. The retainer tabs 2709 can be flat structural elements that extend perpendicularly from the retainer base 2708 to act as a mechanical stop to position the retainer 2704 against the top of the memory module 2702.

The retainer 2704 can be formed from a variety of materials. The retainer 2704 can be plastic, metal, alloy, epoxy, thermoplastic polymer, polycarbonate, acrylonitrile butadiene styrene, nylon, aluminum, stainless steel, spring steel, composite materials, polymer materials, a 3D-printing stock material, or a combination thereof. The retainer 2704 can be formed by 3D printing, extrusion, molding, etching, vacuum forming, assembling, folding, cutting, abrading, or other a combination thereof.

In the retainer placement step, the memory module 2702 can be mounted in the memory socket 2706. In an example, the memory module 2702 can be a SO-DIMM memory module. The memory socket 2706 can be a SO-DIMM memory socket. The retainer 2704 can be positioned above the memory module 2702.

Figure 28:
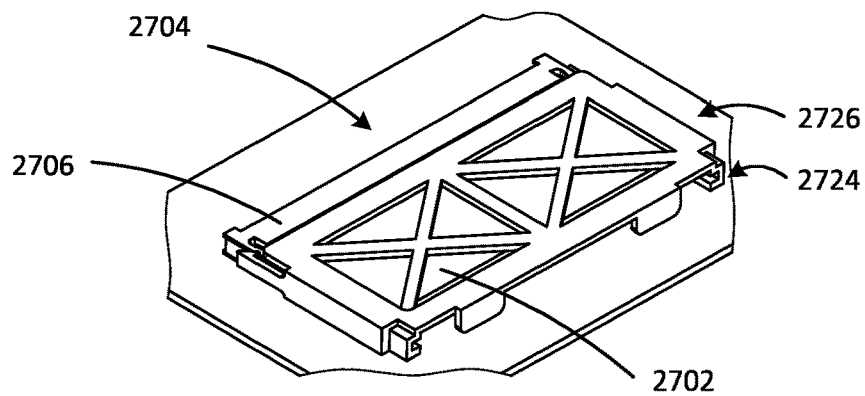
FIG. 28 depicts a retainer positioning step of attaching the retainer to the memory module.

FIG. 28 illustrates a retainer positioning step of attaching the retainer 2704 to the memory module 2702. The retainer 2704 can be positioned to allow the engagement of the retainer 2704 to the memory socket 2706 with the lever latch tips 2716 hooking into the bottom of the memory socket 2706.

The retainer 2704 can be positioned with the retainer slots 2724 aligned with the module tongues 2726. The retainer 2704 can then be slid down the memory module 2702 to engage the module tongues 2726 in the retainer slots 2724.

Figure 29:
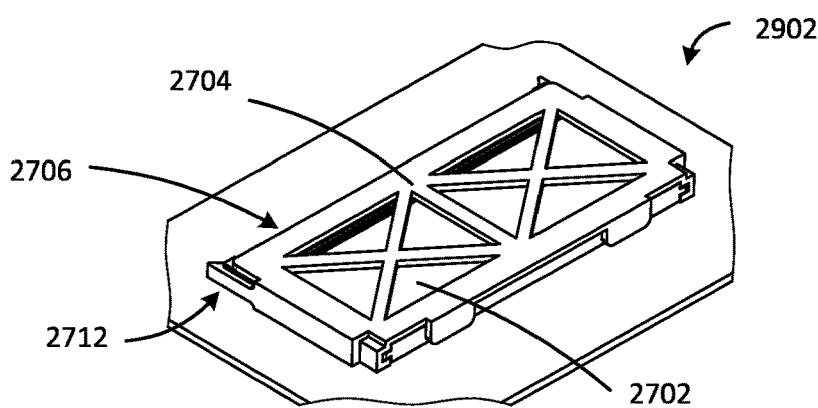
FIG. 29 depicts a retainer locking step of attaching the retainer to the memory module.

FIG. 29 illustrates a retainer locking step of attaching the retainer 2704 to the memory module 2702. The retainer 2704 can be positioned to engage the lever latch 2712 of the retainer 2704 with the memory socket 2706. When the lever latch 2712 is completely over the memory socket 2706, the lever latch tip 2716 is locked into the memory socket 2706 in a locked position 2902.

Figure 30:
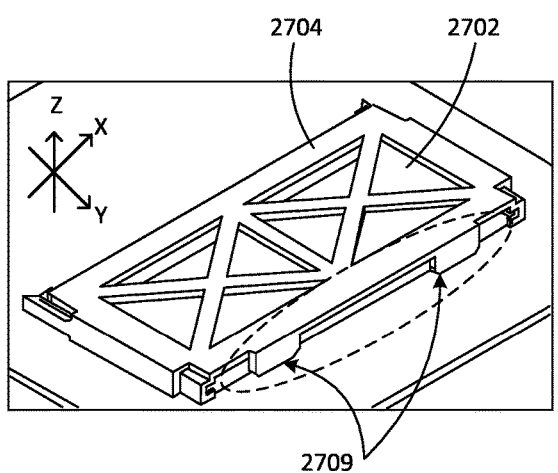
FIG. 30 depicts an example of the retainer retention in the y-direction.

FIG. 30 illustrates an example of the retainer 2704 retention in the y-direction. The retainer 2704 can have the retainer tabs 2709 in direct contact with the top of the memory module 2702 to prevent motion in the y-direction. The retainer tabs 2709 prevent the retainer from moving downward in the y-direction. The retainer tabs 2709 can lock against the top of the memory module 2702 and exert a y-direction force to retain the retainer 2704.

Figure 31:
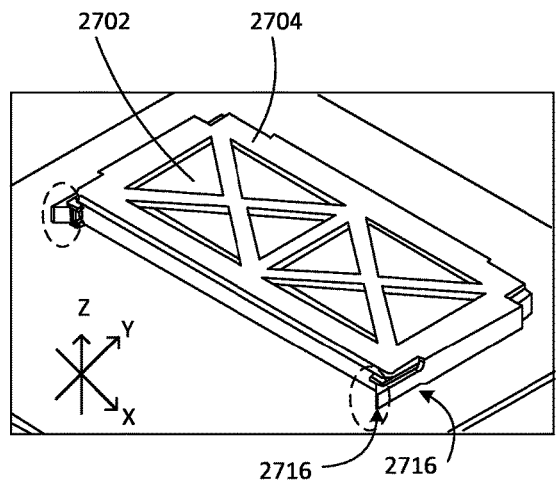
FIG. 31 depicts another example of the retainer retention in the y-direction.

FIG. 31 illustrates another example of the retainer 2704 retention in the y-direction. The retainer 2704 can have the lever latch tips 2716 of the lever latch 2712 locked into the bottom of the memory socket 2706 to prevent upward motion in the y-direction. The lever latch tips 2716 of the lever latch 2712 can exert a vertical force when perturbated to resist upward motion in the y-direction.

Figure 32:
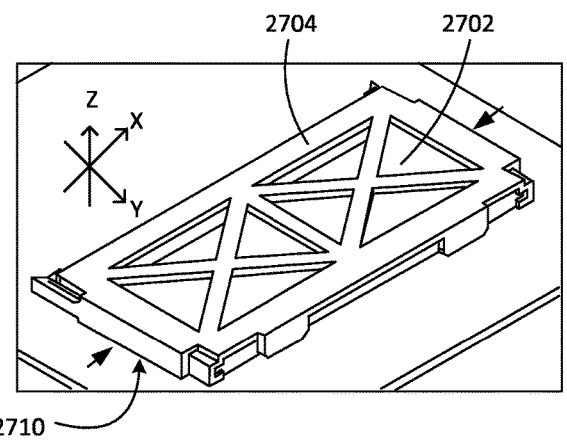
FIG. 32 depicts an example of the retainer retention in the x-direction.

FIG. 32 illustrates an example of the retainer 2704 retention in the x-direction. The retainer arms 2710 can be attached to both sides of the memory module 2702 in the x-direction. The retainer arms 2710 can apply an inward force on both sides of the memory module 2702 to resist motion in the x-direction.

Figure 33:
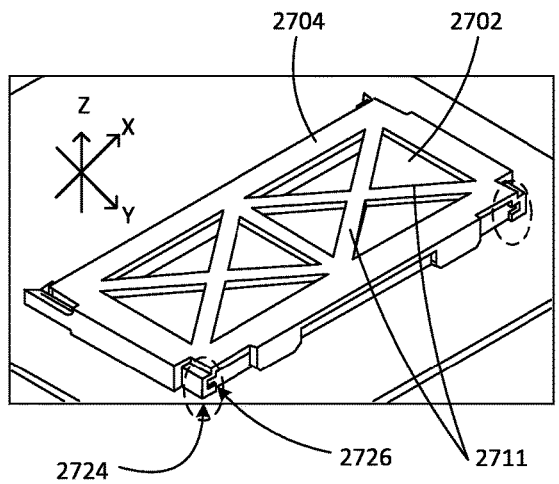
FIG. 33 depicts an example of the retainer retention in the z-direction.

FIG. 33 illustrates an example of the retainer 2704 retention in the z-direction. The module tongue 2726 in the retainer slot 2724 can provide a secure attachment for preventing motion in the z-direction. When perturbated, the sides of the module tongue 2726 can press against the inner walls of the retainer slot 2724 and the z-direction forces can help prevent motion in the z-direction.

The memory module 2702 can have the module tongue 2726 running the length of the side of the memory module 2702 in the y-direction. The module tongue 2726 is an extension out from the side of the memory module 2702 forming a center ridge that can support the memory module 2702. The module tongue 2726 is configured to slide into the retainer slots 2724 of the retainer 2704.

Each of the retainer arms 2710 of the retainer 2702 can have the retainer slot 2724 running along the inner side. The retainer slot 2724 is wide enough to accept the module tongue 2726. The module tongue 2726 and the retainer slot 2724 form a tongue-in-groove joint to secure the memory module 2702 against motion in the z-direction.

The retainer 2704 includes the retainer ribs 2711 to reduce motion in the z-direction. The coupling of the retainer ribs 2711 with a tongue-in-groove joint 2728 of the module tongue 2726 and retainer slot 2724 reduces the amount of z-direction movement because the retainer ribs 2711 can hold the top of the memory module 2702.

Figure 34:
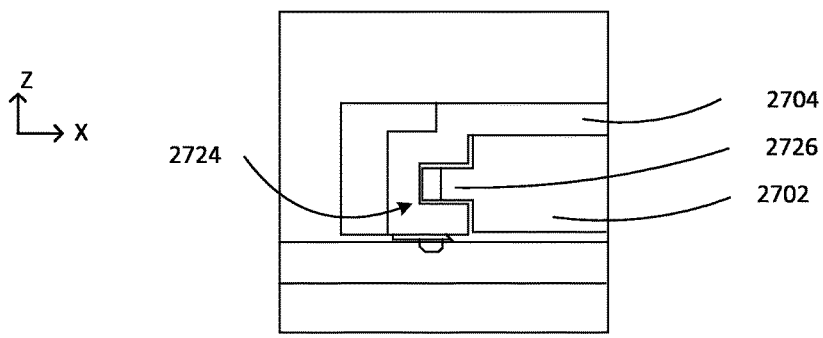
FIG. 34 depicts another example of the retainer retention in the z-direction.

FIG. 34 illustrates another example of the retainer 2704 retention in the z-direction. The memory module 2702 can include the module tongue 2726 inserted into the retainer slot 2724 to form the tongue-in-groove joint 2728.

4.0 Functional Overview

Figure 35:
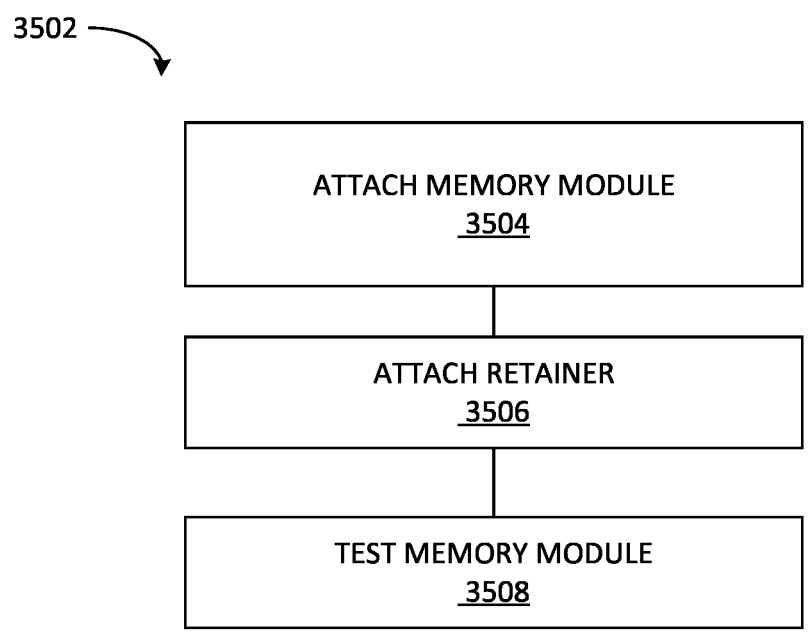
FIG. 35 depicts an example of an operation process flow.

FIG. 35 illustrates an example of an operating process flow 3502. The operating process flow 3502 shows the process for attaching the memory modules 108 in the memory socket 106, attaching the retainer to the memory module 108, and testing the memory module 3508.

The operating process flow 3502 can be implemented in a variety of ways. For example, the operating process flow 3502 can include three steps: an attach memory module step 3504, an attach retainer step 3506, and a test memory module step 3508.

In the attach memory module step 3504, the memory module 1302 can be positioned above the memory socket 1306 and then the memory module 1302 can be pushed downward into the memory socket 1306.

In the attach retainer 3506, the retainer 1304 can be positioned over the memory module 1302 and attached to the memory module 1304 and the memory socket 1306. In some embodiments, the retainer 1304 can be attached to the computer system with the fastener 612.

In some embodiments, the retainer 1304 can provide retention along all three axes, the x-direction, the y-direction, and the z-direction, at the same time. Providing simultaneous retention force can improve the stability of the system.

In the test memory module step 3506, the memory module 1302 secured in the memory socket 1306 and the retainer 1304 can be tested while in a harsh environment. The retainer 1304 can reduce the likelihood of environmental vibration dislodging the memory module 1302 from the memory socket 1306.

It is understood that the retainer and the memory modules can have different embodiment that differ slightly. The elements of the different embodiments can share the same names for similar components or components with similar names.

5.0 Example Embodiments

Examples of some embodiments are represented, without limitation, in the following clauses and use cases:

According to an embodiment, a method of operation of a memory module retention system comprises mounting a memory module in a memory socket; and attaching a retainer to the memory module and the memory socket, the retainer configured to secure the memory module to the memory socket by retaining the memory module in an x-direction, a y-direction, and a z-direction during operation.

In an embodiment, the method further comprises attaching a retainer tab of the retainer directly on the memory module and attaching a lever latch tip directly on the memory socket.

In an embodiment, the method further comprises attaching a module tongue of the memory module in a retainer groove of the retainer to resist movement in the z-direction.

In an embodiment, the method further comprises attaching the memory module between two retainer arms positioned at opposite ends of a retainer base, In an embodiment, the method further comprises attaching retainer ribs to a front side of the memory module.

According to an embodiment, a memory module retention apparatus comprises a retainer base configured to extend across a top side of a memory module and two retainer arms extending perpendicular from the retainer base, the retainer arms positioned at opposite ends of the retainer base.

In an embodiment, the apparatus further comprises a retainer tab extending from the retainer and a lever latch tip of the retainer engaged to the memory socket for resisting movement in the y-direction.

In an embodiment, the apparatus further comprises a retainer groove on an inner side of a retainer arm and a module tongue of the memory module is in the retainer groove of the retainer for resisting movement in the z-direction.

In an embodiment, the apparatus further comprises retainer arms attached directly on the memory module for resisting movement in the x-direction.

In an embodiment, the apparatus further comprises retainer ribs across a front side of the memory module for resisting movement in the z-direction.

6.0 Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

The term "directly on" means contact between two elements with no intervening elements. The term "on" means contact between two or more elements including with intervening elements.

In the specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

It is understood that the system functionality can be described using terms like module, unit, system, subsystem, and component that represent devices that can be implemented using different combinations of hardware, firmware, and software elements. The devices can include electric subsystems, optical subsystems, mechanical subsystems, and other physical elements. These elements can include computing elements that can execute the firmware and software of the system.

The invention claimed is:

1. A method of operation of a memory module retention system comprising:
   mounting a memory module in a memory socket;
   attaching a retainer to the memory module and the memory socket, the retainer configured to secure the memory module to the memory socket by retaining the memory module in an x-direction, a y-direction, and a z-direction during operation, wherein the retainer comprises a hooked retainer tip; and
   engaging, with the hooked retainer tip, a latch head of the memory socket, wherein the latch head of the memory socket is also engaging a notch in the memory module.

2. The method as claimed in claim 1, wherein attaching the retainer includes:
attaching a retainer tab of the retainer directly on the memory module.

3. The method as claimed in claim 1, wherein attaching the retainer includes attaching a module tongue of the memory module in a retainer groove of the retainer to resist movement in the z-direction.

4. The method as claimed in claim 1, wherein attaching the retainer includes attaching the memory module between two retainer arms positioned at opposite ends of a retainer base.

5. The method as claimed in claim 1, wherein attaching the retainer includes attaching retainer ribs to a front side of the memory module.

6. A memory module retention apparatus comprising:
a retainer base configured to extend across a top side of a memory module;
two retainer arms extending perpendicular from the retainer base, the retainer arms positioned at opposite ends of the retainer base, wherein the retainer arms comprise a hooked retainer tip that is configured to engage a latch head of a memory socket that is engaging a notch in the memory module.

7. The apparatus as claimed in claim 6, wherein the retainer includes a retainer tab extending from the retainer and a lever latch tip of the retainer engaged to the memory socket for resisting movement in the y-direction.

8. The apparatus as claimed in claim 6, wherein the retainer includes a retainer groove on an inner side of a retainer arm and a module tongue of the memory module is in the retainer groove of the retainer for resisting movement in the z-direction.

9. The apparatus as claimed in claim 6, wherein the retainer includes retainer arms attached directly on the memory module for resisting movement in the x-direction.

10. The apparatus as claimed in claim 6, wherein the retainer includes retainer ribs across a front side of the memory module for resisting movement in the z-direction.

* * * * *